United States Patent
Uchida et al.

(10) Patent No.: US 10,826,021 B2
(45) Date of Patent: Nov. 3, 2020

(54) ORGANIC ELECTROLUMINESCENCE DEVICE INCLUDING A PLURALITY OF UNIT REGIONS EACH INCLUDING A LIGHT EMITTING AREA AND A TRANSMISSIVE AREA

(71) Applicant: Sharp Kabushiki Kaisha, Osaka (JP)

(72) Inventors: Hideki Uchida, Sakai (JP); Katsuhiro Kikuchi, Sakai (JP); Yoshiyuki Isomura, Sakai (JP); Masanori Ohara, Sakai (JP); Satoshi Inoue, Sakai (JP); Eiji Koike, Sakai (JP); Yuto Tsukamoto, Sakai (JP); Asae Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 18 days.

(21) Appl. No.: 15/758,792

(22) PCT Filed: Aug. 10, 2016

(86) PCT No.: PCT/JP2016/073546
§ 371 (c)(1),
(2) Date: Mar. 9, 2018

(87) PCT Pub. No.: WO2017/043243
PCT Pub. Date: Mar. 16, 2017

(65) Prior Publication Data
US 2018/0287099 A1    Oct. 4, 2018

(30) Foreign Application Priority Data
Sep. 10, 2015    (JP) .................................. 2015-178568

(51) Int. Cl.
*H01L 51/52*    (2006.01)
*H05B 33/24*    (2006.01)
(Continued)

(52) U.S. Cl.
CPC ............ *H01L 51/5271* (2013.01); *G02B 5/20* (2013.01); *H01L 27/3246* (2013.01);
(Continued)

(58) Field of Classification Search
USPC ............................................... 257/98; 438/27
See application file for complete search history.

(56) References Cited

U.S. PATENT DOCUMENTS 5,969,474 A     10/1999  Arai
2004/0211971 A1*  10/2004  Takei ................ G02F 1/133603
                                             257/98
(Continued)

FOREIGN PATENT DOCUMENTS

JP    10-125469 A    5/1998
JP    2003-229283 A  8/2003
(Continued)

OTHER PUBLICATIONS

Official Communication issued in International Patent Application No. PCT/JP2016/073546, dated Nov. 8, 2016.

*Primary Examiner* — Sheng-Bai Zhu
(74) *Attorney, Agent, or Firm* — Keating & Bennett, LLP

(57) ABSTRACT

An organic electroluminescence device according to one aspect of the disclosure includes a base material including a recessed portion on an upper face, and a light emitting element including a reflective layer, a filling layer having optical transparency, a first electrode having optical transparency, an organic layer including at least a light emitting layer, and a second electrode having optical transparency. The reflective layer is disposed at least on a surface of the recessed portion. The filling layer is disposed at an inside of the recessed portion with the reflective layer interposed between the recessed portion and the filling layer. The first electrode is disposed at least on an upper-layer side of the filling layer. The organic layer is disposed on an upper layer
(Continued)

of the first electrode. The second electrode is disposed on an upper-layer side of the organic layer. The organic electroluminescence device includes a display region that is divided into a plurality of unit regions. The plurality of unit regions each having the light emitting element has a light emitting area and a transmissive area that are partitioned.

17 Claims, 26 Drawing Sheets

(51) Int. Cl.
- *G02B 5/20* (2006.01)
- *H05B 33/28* (2006.01)
- *H01L 27/32* (2006.01)
- *H01L 29/786* (2006.01)
- *H01L 51/00* (2006.01)
- *H01L 51/56* (2006.01)
- *H01L 51/50* (2006.01)
- *H01L 27/12* (2006.01)

(52) U.S. Cl.
CPC ...... *H01L 27/3262* (2013.01); *H01L 27/3276* (2013.01); *H01L 27/3288* (2013.01); *H01L 29/7869* (2013.01); *H01L 51/0021* (2013.01); *H01L 51/5234* (2013.01); *H01L 51/56* (2013.01); *H05B 33/24* (2013.01); *H05B 33/28* (2013.01); *H01L 27/124* (2013.01); *H01L 27/1225* (2013.01); *H01L 27/322* (2013.01); *H01L 27/3211* (2013.01); *H01L 27/3248* (2013.01); *H01L 27/3258* (2013.01); *H01L 51/5012* (2013.01); *H01L 51/5016* (2013.01); *H01L 51/5044* (2013.01); *H01L 51/5209* (2013.01); *H01L 51/5225* (2013.01); *H01L 51/5265* (2013.01); *H01L 2227/323* (2013.01); *H01L 2251/308* (2013.01); *H01L 2251/5315* (2013.01); *H01L 2251/558* (2013.01)

(56) References Cited

U.S. PATENT DOCUMENTS

| | | | |
|---|---|---|---|
| 2005/0127485 A1* | 6/2005 | Shei | H01L 33/60 257/678 |
| 2006/0152151 A1* | 7/2006 | Seo | H01L 27/322 313/506 |
| 2010/0051949 A1 | 3/2010 | Yamazaki et al. | |
| 2010/0253215 A1* | 10/2010 | Fukagawa | H01L 51/5234 313/504 |
| 2011/0147770 A1 | 6/2011 | Hwang et al. | |
| 2011/0237409 A1* | 9/2011 | Bull | A63B 21/0004 482/126 |
| 2012/0049219 A1* | 3/2012 | Kamiya | H01L 33/382 257/98 |
| 2013/0113843 A1 | 5/2013 | Yamazaki | |
| 2013/0187131 A1 | 7/2013 | Chung et al. | |
| 2014/0159021 A1* | 6/2014 | Song | H01L 27/322 257/40 |
| 2014/0159064 A1* | 6/2014 | Sakariya | H01L 25/0753 257/88 |
| 2014/0264291 A1* | 9/2014 | Zhang | H01L 51/5271 257/40 |
| 2015/0060832 A1* | 3/2015 | Ito | H01L 51/5225 257/40 |
| 2015/0090992 A1* | 4/2015 | Miyazawa | H01L 51/5271 257/40 |
| 2015/0138463 A1* | 5/2015 | Jinta | H01L 51/5218 349/33 |
| 2016/0035807 A1* | 2/2016 | Shi | H01L 51/5215 257/40 |

FOREIGN PATENT DOCUMENTS

| | | |
|---|---|---|
| JP | 2010-080952 A | 4/2010 |
| JP | 2011-129510 A | 6/2011 |
| JP | 2011-228229 A | 11/2011 |
| JP | 2013-117719 A | 6/2013 |
| JP | 2013-149971 A | 8/2013 |

* cited by examiner

ORGANIC ELECTROLUMINESCENCE DEVICE INCLUDING A PLURALITY OF UNIT REGIONS EACH INCLUDING A LIGHT EMITTING AREA AND A TRANSMISSIVE AREA

TECHNICAL FIELD

The disclosure relates to an organic electroluminescence device, a method for manufacturing the organic electroluminescence device, an illumination device, and a display device.

This application claims priority from JP 2015-178568, filed Sep. 10, 2015, the entirety of which is incorporated by reference herein.

BACKGROUND ART

Development of an organic EL display as a candidate of next generation display techniques has progressed. Electroluminescence is shortened to "EL" hereafter. The organic EL display is a self light emitting element and has a structure that is simpler than a liquid crystal display including a white backlight, a liquid crystal substrate (TFT substrate), and a color filter substrate. For this reason, production of a thin and light flexible display at low cost in the future is expected.

The organic EL display can be a transparent display in a non-display state (hereinafter referred to as transparent display). When an organic material having a thin-film shape and high transmittance is used and a pair of transparent electrodes are used, the organic EL display can be a transparent display having high transmittance.

Therefore, the organic EL display can be used as a known display, and in addition, a display format of a new category, such as a flexible display and a transparent display (for example, PTL 1 and 2), can be achieved. An organic EL light emitting element of PTL 1 is a both-sides light emitting element having a transparent electrode on both sides thereof.

CITATION LIST

Patent Literature

PTL 1: JP 10-125469 A
PTL 2: JP 2013-149971 A

SUMMARY

Technical Problem

In PTL 1, the organic EL light emitting element has excellent transparency. Since both sides are irradiated with light, a reverse image is output on one of the both sides, and the luminance on the other side is decreased.

In PTL 2, a semi-transparent state can be achieved by restriction of a light emitting region. However, the light emission area decreases. Therefore, the load on a light-emitting unit to exhibit required luminance is increased, the power consumption is increased, and the lifetime of the element is decreased.

An aspect of the disclosure is made in view of the above-described problems of the related art. An object of the disclosure is to provide an organic electroluminescence device that can provide an element having high light emitting efficiency and provide a transmissive display having high transmittance, a method for manufacturing the organic electroluminescence device, an illumination device, and a display device.

Solution to Problem

An organic electroluminescence device according to one aspect of the disclosure includes a base material including a recessed portion on an upper face, and a light emitting element, the light emitting element including a reflective layer, a filling layer having optical transparency, a first electrode having optical transparency, an organic layer including at least a light emitting layer, and a second electrode having optical transparency. The reflective layer is disposed at least on a surface of the recessed portion. The filling layer is disposed at an inside of the recessed portion with the reflective layer interposed between the recessed portion and the filling layer. The first electrode is disposed at least on an upper-layer side of the filling layer. The organic layer is disposed on an upper layer of the first electrode. The second electrode is disposed on an upper-layer side of the organic layer. The organic electroluminescence device includes a display region that is divided into a plurality of unit regions. The plurality of unit regions each having the light emitting element has a light emitting area and a transmissive area that are partitioned.

In an organic electroluminescence device according to one aspect of the disclosure, the light emitting area and the transmissive area may satisfy a ratio of the light emitting area to the sum of the light emitting area and the transmissive area of less than 50%.

In an organic electroluminescence device according to one aspect of the disclosure, a plurality of recessed portions may be provided in the light emitting area, and the reflective layer is provided in the plurality of recessed portions.

In an organic electroluminescence device according to one aspect of the disclosure, a portion of the reflective layer may be in contact with a portion of the first electrode.

In an organic electroluminescence device according to one aspect of the disclosure, a lower face of the first electrode at a position inside the recessed portion may be positioned lower than a plane including the upper face of the base material.

In an organic electroluminescence device according to one aspect of the disclosure, the light emitting area may include a plurality of active elements that are configured to independently control light emission.

In an organic electroluminescence device according to one aspect of the disclosure, the active elements may be formed from an oxide semiconductor.

In an organic electroluminescence device according to one aspect of the disclosure, the active elements may be electrically connected to the light emitting element via the reflective layer.

In an organic electroluminescence device according to one aspect of the disclosure, a wiring line for operating the active elements may be provided. The reflective layer may be provided on the wiring line.

In an organic electroluminescence device according to one aspect of the disclosure, a color filter may be provided on the light emitting element.

In an organic electroluminescence device according to one aspect of the disclosure, the area of the color filter may be substantially similar to that of a region where the reflective layer is provided.

A method for manufacturing the organic electroluminescence device according to one aspect of the disclosure includes forming a recessed portion on an upper face of a base material; forming a reflective layer at least along a surface of the recessed portion; forming a filling layer having optical transparency at an inside of the recessed portion with the reflective layer interposed between the recessed portion and the filling layer; forming a first electrode having optical transparency at least on an upper-layer side of the filling layer; forming an organic layer on an upper-layer side of the first electrode, the organic layer including at least a light emitting layer; and forming a second electrode on an upper-layer side of the organic layer, the second electrode having optical transparency and light reflectivity. The organic electroluminescence device includes a display region divided into a plurality of unit regions. The plurality of unit regions each having the light emitting element includes a light emitting area and a transmissive area that are partitioned.

An illumination device according to one aspect of the disclosure includes a base material including a recessed portion on an upper face, and a light emitting element, the light emitting element including a reflective layer, a filling layer having optical transparency, a first electrode having optical transparency, an organic layer including at least a light emitting layer, and a second electrode having optical transparency. The reflective layer is disposed at least on a surface of the recessed portion. The filling layer is disposed at an inside of the recessed portion with the reflective layer interposed between the recessed portion and the filling layer. The first electrode is disposed at least on an upper-layer side of the filling layer. The organic layer is disposed on an upper layer of the first electrode. The second electrode is disposed on an upper-layer side of the organic layer. The organic electroluminescence device includes a display region that is divided into a plurality of unit regions. The plurality of unit regions each having the light emitting element has a light emitting area and a transmissive area that are partitioned.

A display device according to one aspect of the disclosure includes a base material including a recessed portion on an upper face, and a light emitting element, the light emitting element including a reflective layer, a filling layer having optical transparency, a first electrode having optical transparency, an organic layer including at least a light emitting layer, and a second electrode having optical transparency. The reflective layer is disposed at least on a surface of the recessed portion. The filling layer is disposed at an inside of the recessed portion with the reflective layer interposed between the recessed portion and the filling layer. The first electrode is disposed at least on an upper-layer side of the filling layer. The organic layer is disposed on an upper layer of the first electrode. The second electrode is disposed on an upper-layer side of the organic layer. The organic electroluminescence device includes a display region divided into a plurality of unit regions. The plurality of unit regions each having the light emitting element has a light emitting area and a transmissive area that are partitioned.

Advantageous Effects of Disclosure

Some aspects of the disclosure can provide an organic electroluminescence device, an illumination device, and a display device that can provide an element having high light emitting efficiency and provide a transmissive display having high transmittance.

DESCRIPTION OF EMBODIMENTS

First Embodiment

A description follows regarding an organic EL device of a first embodiment of the disclosure, with reference to FIGS. 1 to 13B.

The organic EL device of the first embodiment is an example of a top-emitting transparent display using a microcavity structure.

Figure 1:
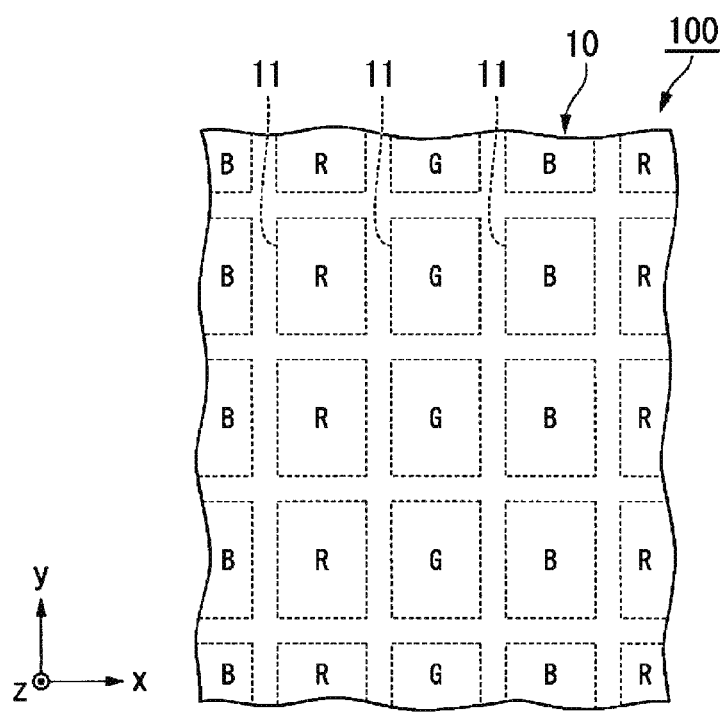
FIG. 1 is a view of a display region of an organic EL device according to a first embodiment.

FIG. 1 is a view of a display region of the organic EL device of the first embodiment.

Note that in each of the drawings below, the dimensional scale is illustrated differently depending on the component, so that each component is easily visible.

As illustrated in FIG. 1, an organic EL device (organic electroluminescence device, or display device) 100 of the present embodiment includes a plurality of unit regions 11 that are separated from each other. The organic EL device includes a display region 10, and the display region 10 includes the plurality of unit regions 11 corresponding to RGB. Each of the unit regions 11 is extended along a y-axis in a stripe shape, and is repeatedly disposed along an x-axis in an order of RGB. FIG. 1 is an example in which each of the unit regions 11 of RGB is arranged in a stripe shape. However, the present embodiment is not limited to the example. The arrangement of the unit regions 11 of RGB may be a known RGB pixel arrangement such as a mosaic arrangement and a delta arrangement.

Each of the unit regions 11 of RGB can be used as an illumination device that simultaneously emits red light, green light, and blue light to produce white light. However, applications of the organic EL device 100 are not limited to illumination devices. For example, the organic EL device 100 can be applied to a display device in which each of the unit regions 11 corresponding to red, green, and blue is used for a red sub pixel, a green sub pixel, and a blue sub pixel, respectively, and the three sub pixels form one pixel.

Figure 2:
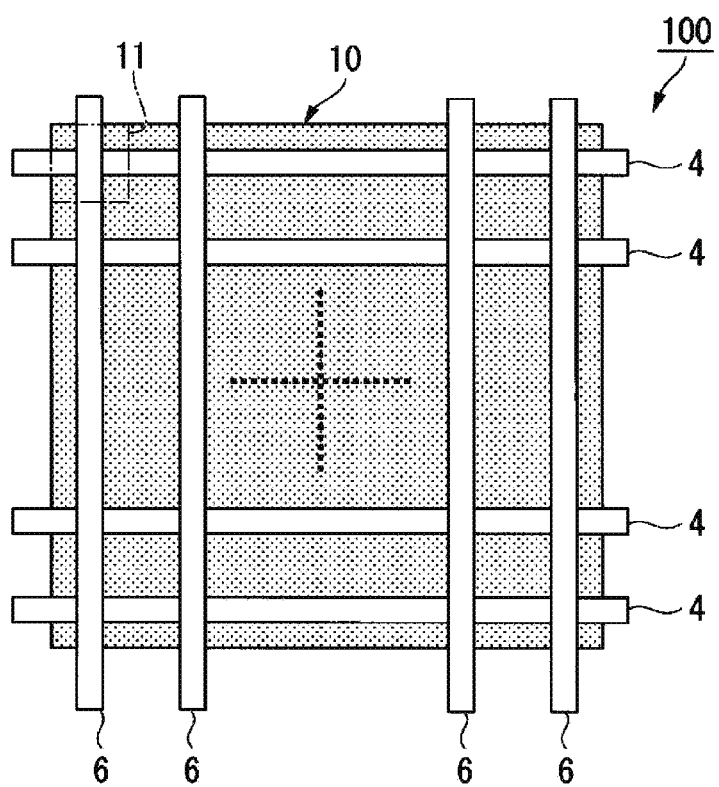
FIG. 2 is a view of detail of the display region of the organic EL device according to the first embodiment.

FIG. 2 is a view of detail of the display region of the organic EL device of the first embodiment.

As illustrating in FIG. 2, the planar shape of the display region 10 in the organic EL device 100 is, for example, a square with sides of 2 mm. The shape of one of the unit regions 11 is, for example, a square with sides of 100 μm. Each of the unit regions 11 is positioned at a portion where a first electrode 4 and a second electrode 6 intersect each other. In the display region 10, there are a plurality of first electrodes 4 and a plurality of second electrodes 6 that intersect each other.

Figure 3A:
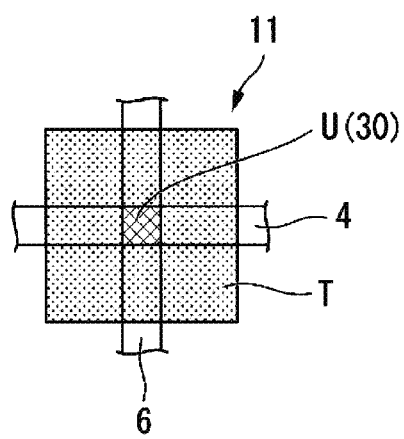
FIG. 3A is an enlarged plan view of one unit region.

FIG. 3A is an enlarged plan view of one of the unit regions.

As illustrated in FIG. 3A, the unit regions 11 each have a light emitting area U and a transmissive area T.

This transmissive area T can be used to realize a transmissive display in which an opposite side of the display region 10 is transparently seen.

The light emitting area U is a region where external light is not transmitted. The first electrode 4 and the second electrode 6 each have a width of 30 μm. In the unit region 11, an intersection region (30-μm square) between the first electrode 4 and the second electrode 6 corresponds to the light emitting area U. The width of each electrode is not limited to the aforementioned dimension, and can be appropriately changed.

Herein, it is preferable that the light emitting area U and the transmissive area T satisfy a relationship where the ratio of the light emitting area U to the sum of the light emitting area U and the transmissive area T is less than 50%. That is, it is preferable that the light emitting area U be smaller than the transmissive area T.

Figure 3B:
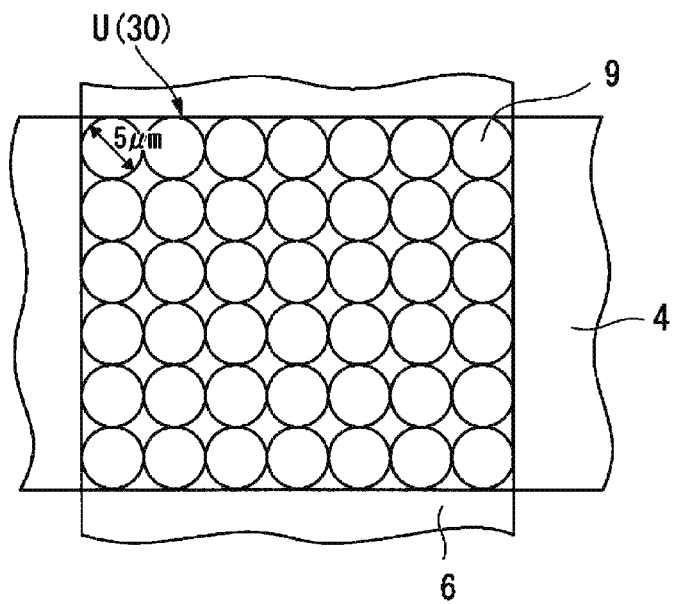
FIG. 3B is an enlarged plan view of a light emitting area in one unit region.

FIG. 3B is an enlarged plan view of the light emitting area in one of the unit regions.

As illustrated in FIG. 3B, an organic EL element (light emitting element) 30 is provided in the light emitting area U of each of the unit regions 11. The organic EL element 30 has a plurality of recessed portions 9 having a circular plane. The diameter φ of the recessed portions 9 is, for example, approximately 5 μm. The plurality of recessed portions 9 are regularly disposed in vertical and horizontal directions and form a lattice shape. The density of the recessed portions 9 satisfies that the ratio of the total area of the plurality of recessed portions 9 to the area of the light emitting area U is approximately 70%.

Figure 4:
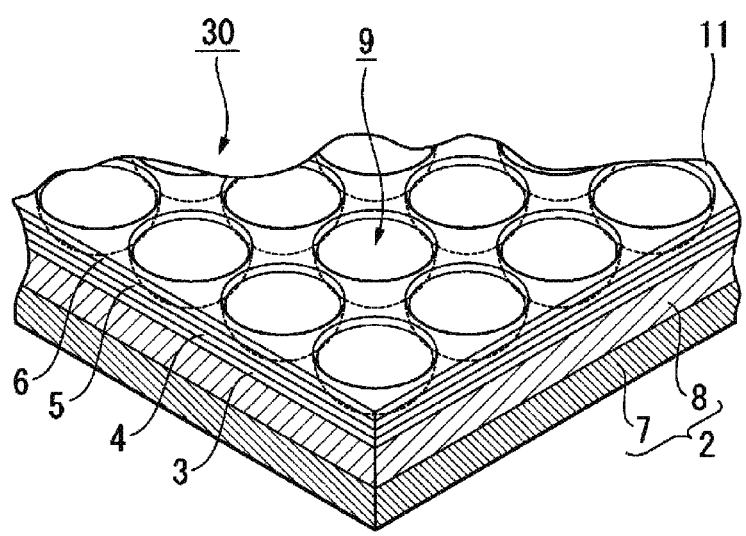
FIG. 4 is a cross-sectional view of the organic EL device sectioned along a plane orthogonal to an upper face of the organic EL device.
Figure 5:
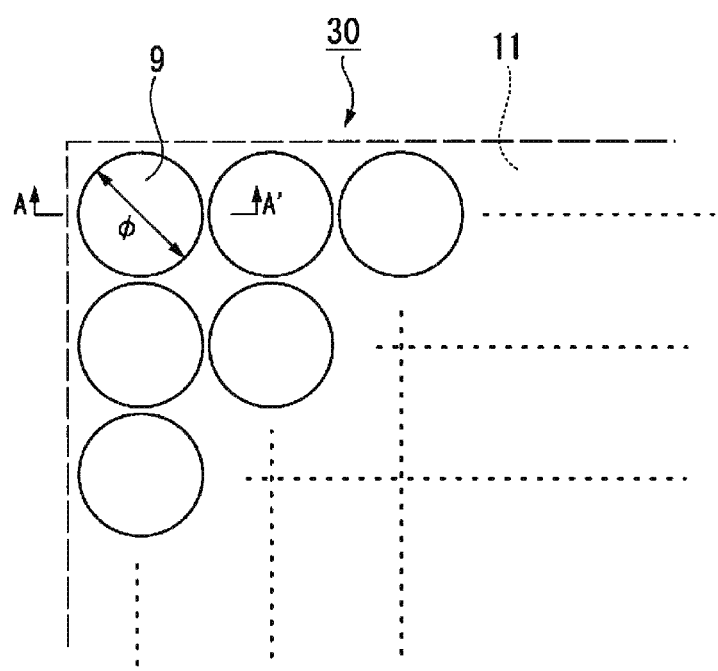
FIG. 5 is an enlarged plan view of a portion of the light emitting area.
Figure 6:
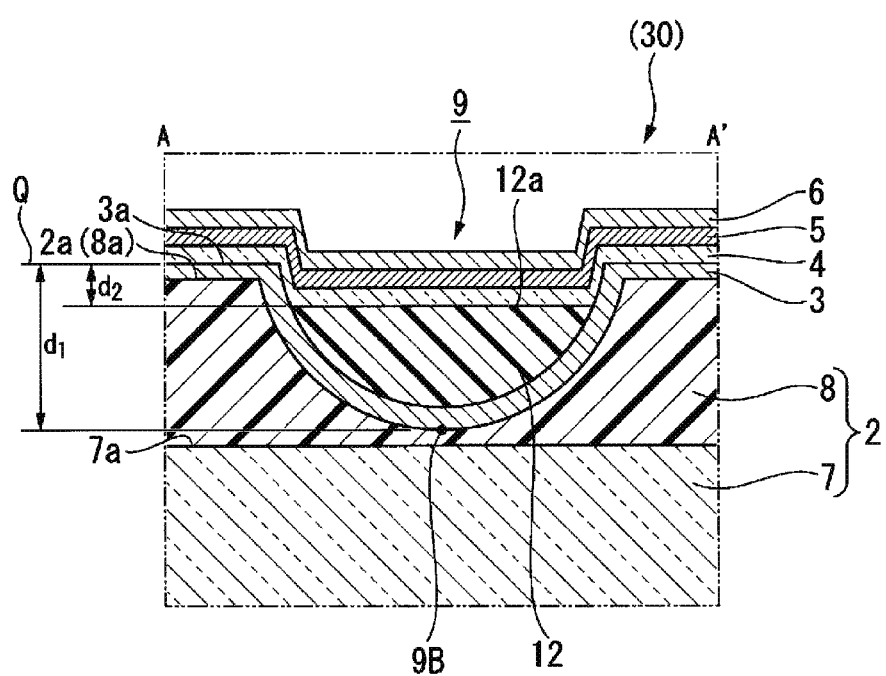
FIG. 6 is a cross-sectional view taken along line A-A' in FIG. 5.

FIG. 4 is a cross-sectional view of the organic EL device sectioned along a plane orthogonal to an upper face of the organic EL device. FIG. 4 illustrates a light emitting area portion. FIG. 5 is an enlarged plan view of a portion of the light emitting area. FIG. 6 is a cross-sectional view taken along line A-A' in FIG. 5.

As illustrated in FIG. 4, the organic EL device 100 of the present embodiment includes a base material 2, a reflective layer 3, the first electrode 4, an organic layer 5 including a light emitting layer, and the second electrode 6. The organic EL device 100 is a top-emitting display in which light emitted by the light emitting layer is emitted from the second electrode 6 side. The base material 2 includes a substrate 7 and a foundation layer 8. The foundation layer 8, the reflective layer 3, the first electrode 4, the organic layer 5, and the second electrode 6 are layered on the upper face of the substrate 7 in this order from the substrate 7 side.

For example, a glass substrate is employed for the substrate 7. Since the organic EL device 100 is a top-emitting organic EL device, the substrate 7 does not need to have optical transparency. For example, a semiconductor substrate such as a silicon substrate may be employed.

As illustrated in FIG. 5, the plurality of recessed portions 9 are formed in the light emitting area U of the organic EL device 100. As illustrated in FIG. 6, each of the recessed portions 9 is opened upward on an upper face 2a of the base material 2. The cross-sectional shape of the recessed portions 9 is a circular arc. That is, an inner face of each of the recessed portions 9 three-dimensionally forms a portion of a spherical surface. The foundation layer 8 includes a photosensitive resin, such as acrylic, epoxy, and polyimide resins. Use of a photosensitive resin for the material for the foundation layer 8 is suitable to a method for forming the recessed portions 9 described later. However, in a case where a method other than the forming method described later is applied, the material constituting the foundation layer 8 does not need to be photosensitive.

Moreover, the material constituting the foundation layer 8 may not be a resin, and may be an inorganic material. In the present embodiment, the base material 2 including the substrate 7 and the foundation layer 8 is used. However, the foundation layer 8 does not need to be used, and the recessed portions 9 may be formed in the substrate itself.

The reflective layer 3 is provided in each of the unit regions 11. The reflective layer 3 is formed in the light emitting area U in each of the unit regions 11. The reflective layer 3 is formed on upper face 8a of the foundation layer 8 including an inner face of the plurality of recessed portions 9. In this case, the reflective layer 3 may be formed continuously over the plurality of recessed portions 9 or discontinuously in each of the recessed portions 9. A metal having high reflectance, such as aluminum and silver, is suitably used as a material constituting the reflective layer 3. In the case of the present embodiment, the reflective layer 3 is formed from, for example, an aluminum film having a film thickness of 100 nm.

A filling layer 12 is disposed at the inside of each of the recessed portions 9 with the reflective layer 3 interposed therebetween. An upper face 12a of the filling layer 12 is positioned lower than a plane Q including an upper face 3a of the reflective layer 3. d2 is the height from the upper face 12a of the filling layer 12 to the upper face 3a of the reflective layer 3. In the case of the present embodiment, the height d2 is set to, for example, 0.1 mm d1 is the height from a lowermost portion 9B of each of the recessed portions 9 to the upper face 3a of the reflective layer 3. A specific example of the depth d1 is described later.

The upper face 12a of the filling layer 12 is preferably positioned lower than the plane Q including the upper face 3a of the reflective layer 3. However, even when the upper face 12a of the filling layer 12 is at the highest position, the position of the upper face 12a of the filling layer 12 need to be at the same height as the plane Q. In other words, the filling layer 12 is not formed so as to rise above the plane Q. The filling layer 12 includes a resin having optical transparency.

Specifically, an acrylic resin having a transmittance of 95% is employed for a material for the filling layer 12. The refractive index of the filling layer 12 of the present embodiment is, for example, 1.5.

In the display region 10, the plurality of first electrodes 4 are extended in parallel. In each of the unit regions 11, the first electrode 4 is formed across the upper face 12a of the filling layer 12 and the upper face 3a of the reflective layer 3 that are disposed in each of the plurality of recessed portions 9 that are present in the light emitting area U. A portion of the first electrode 4 positioned on the upper face 8a of the foundation layer 8 is in contact with a portion of the reflective layer 3. The lower face of the first electrode 4 at a position inside each of the recessed portions 9 is in contact with the upper face 12a of the filling layer 12. Accordingly, the lower face of the first electrode 4 is positioned lower than the plane Q including the upper face 3a of the reflective layer 3.

The first electrode 4 is a transparent electrode formed from a transparent conductive film such as indium tin oxide (ITO) or indium zinc oxide (IZO), and has optical transparency. In the case of the present embodiment, the first electrode 4 is formed from, for example, ITO having a film thickness of 120 nm. The first electrode 4 functions as an anode for injecting holes into the organic layer 5.

The organic layer 5 is formed in the light emitting area U. The organic layer 5 is layered along the upper face of the first electrode 4 formed across the plurality of recessed portions 9. The organic layer 5 is a layered body formed of an organic material. The organic layer 5 includes a hole injecting layer, a hole transport layer, the light emitting layer, an electron transport layer, and an electron injecting layer. The lower face of the organic layer 5 is positioned lower than the plane Q including the upper face 3a of the reflective layer 3. Detailed description of the configuration and function of each layer configuring the organic layer 5 is given later.

The second electrode 6 is layered along the upper face of the organic layer 5. The second electrode 6 is a transparent electrode formed from a transparent conductive film such as indium tin oxide (ITO) or indium zinc oxide (IZO), and has optical transparency. In the case of the present embodiment, the second electrode 6 is formed from, for example, ITO having a film thickness of 120 nm. The second electrode 6 functions as a cathode for injecting electrons into the organic layer 5.

In the present embodiment, a region between the first electrode 4 and the second electrode 6 in the light emitting area U forms a microcavity structure. Light emitted from the light emitting layer is multiply reflected between the first electrode 4 and the second electrode 6. At that time, a component with a specific wavelength of the light emitted from the light emitting layer is enhanced. Moreover, although omitted from the illustration in FIG. 6, an optical adjustment layer known as a cap layer is layered on the upper face of the second electrode 6.

Figure 7:
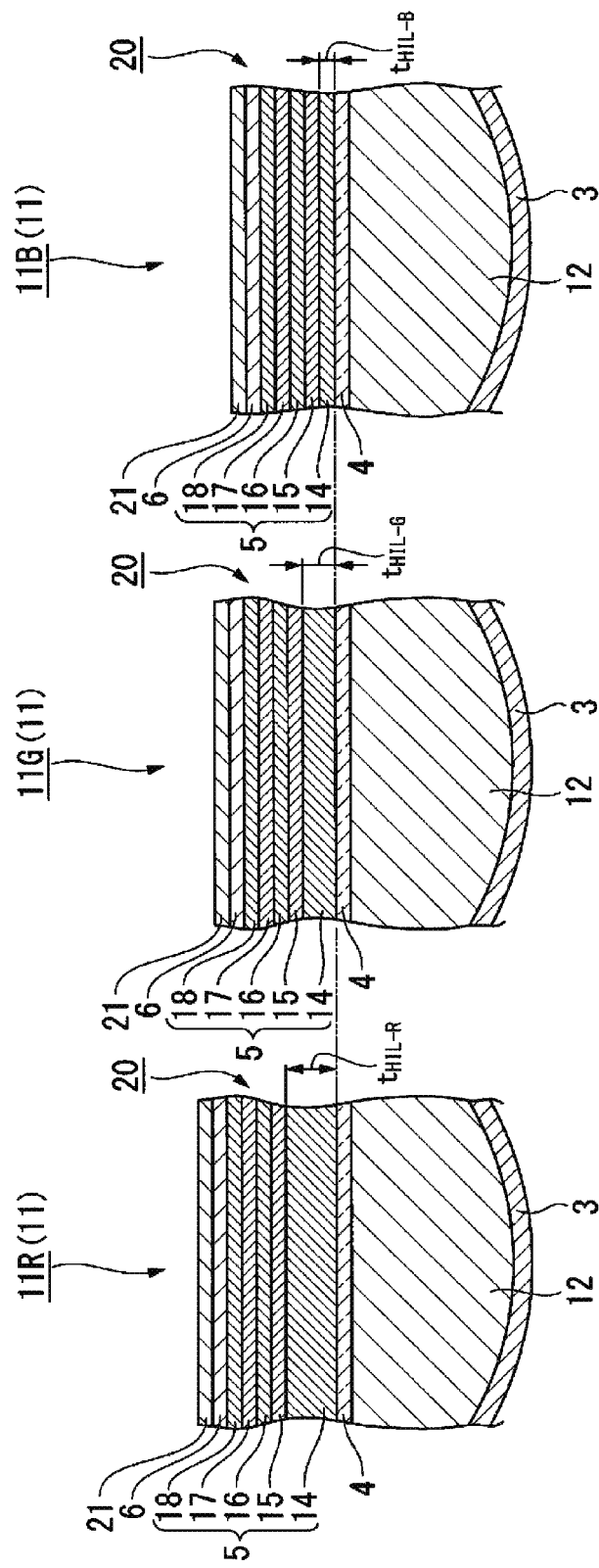
FIG. 7 is a cross-sectional view of detail of a recessed portion structure.

FIG. 7 is a cross-sectional view of detail of a recessed portion structure. Herein, one of a plurality of recessed portion structures constituting the organic EL element 30 is illustrated on a larger scale. The recessed portion structures of the organic EL element 30 in three unit regions 11R, 11G, and 11B have a common basic configuration except that the film thickness of the hole injecting layer is different.

As illustrated in FIG. 7, the organic layer 5 is provided on an upper layer of the first electrode 4 in the recessed portion structures. The organic layer 5 includes a layered film including a hole injecting layer 14, a hole transport layer 15, a light emitting layer 16, an electron transport layer 17, and an electron injecting layer 18 layered from the first electrode 4 side thereof. However, layers other than the light emitting layer 16 may be appropriately provided as necessary. A single layer may serve as both a transport layer and an injecting layer. In the present embodiment, as described above, an example is given of an organic layer having a 5-layer structure of the hole injecting layer 14, the hole transport layer 15, the light emitting layer 16, the electron transport layer 17, and the electron injecting layer 18. Moreover, as necessary, a layer for preventing migration of charge to the opposite side electrode, such as a hole blocking layer or an electron blocking layer, may be appropriately added.

The hole injecting layer 14 is a layer that functions to increase the hole injection efficiency from the first electrode 4 to the light emitting layer 16. As the material for the hole injecting layer 14, benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, or a derivative thereof; or a heterocyclic, conjugated monomer, oligomer, or polymer of an polysilane-based compound, a vinylcarbazole-based compound, a thiophene-based compound, or an aniline-based compound may be employed. Molybdenum oxide may be blended with these organic materials. For example, the blending ratio of the organic material is approximately 80% and the blending ratio of the molybdenum oxide is approximately 20%.

The hole transport layer 15 is a layer that functions to increase the hole transport efficiency from the first electrode 4 to the light emitting layer 16. An organic material similar to the hole injecting layer 14 may be employed in the hole transport layer 15. Note that the hole injecting layer 14 and the hole transport layer 15 may be integrated, or may be formed as individual layers.

The light emitting layer 16 functions to emit light when holes injected from the first electrode 4 side recombine with electrons injected from the second electrode 6 side and the electrons release energy. The material for the light emitting layer 16 includes, for example, a host material and a dopant material. The material for the light emitting layer 16 may also include an assist material. The host material is included at the highest ratio among the constituent materials in the light emitting layer 16. For example, the blending ratio of the host material is approximately 90% and the blending ratio of the dopant material is approximately 10%. The host material is easily formed into the film of the light emitting layer 16 and functions to maintain the film state of the light emitting layer 16. Accordingly, it is desirable that the host material is a stable compound that does not easily crystallize after film formation and does not easily undergo chemical change. Moreover, when an electric field is applied between the first electrode 4 and the second electrode 6, the host material functions such that recombination of carriers occurs within the host molecules, and excitation energy is transferred to the dopant material, causing the dopant material to emit light. The thickness of the light emitting layer 16 is, for example, approximately 60 nm.

Specific examples of the material for the light emitting layer 16 include materials that include a material having a high light-emission efficiency, such as a low-molecular fluorescent colorant, a fluorescent macromolecule, or a metal complex. Examples of the material for the light emitting layer 16 include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, and derivatives thereof; tris(8-quinolinato)aluminum complex; bis(benzoquinolinato)beryllium complex; tri(dibenzoylmethyl)phenanthroline europium complex; and ditoluylvinylbiphenyl.

The electron transport layer 17 functions to increase the electron transport efficiency from the second electrode 6 to the light emitting layer 16. As the material for the electron transport layer 17, for example, quinoline, perylene, phenanthroline, bisstyryl, pyrazine, triazole, oxazole, oxadiazole, fluorenone, or a derivative or a metal complex thereof may be employed. Specifically, tris(8-hydroxyquinoline)aluminum, anthracene, naphthalene, phenanthrene, pyrene, anthracene, perylene, butadiene, coumarin, acridine, stilbene, 1,10-phenanthroline, or a derivative or a metal complex thereof may be employed. The thickness of the electron transport layer 17 is, for example, approximately 15 nm.

The electron injecting layer 18 functions to increase the electron injection efficiency from the second electrode 6 to the light emitting layer 16. As the material for the electron injecting layer 18, for example, compounds such as calcium metal (Ca) or lithium fluoride (LiF) can be employed. Note that the electron transport layer 17 and the electron injecting layer 18 may be integrated, or may be formed as individual layers. The thickness of the electron injecting layer 18 is, for example, approximately 0.5 nm.

A microcavity structure 20 has an effect to enhance light with a specific wavelength by using resonance of light generated between the first electrode 4 and the second electrode 6. In the case of the present embodiment, the wavelengths of lights emitted from the red, green, and blue unit regions 11R, 11G, and 11B are different. Therefore, an optical path length between the first electrode 4 and the second electrode 6 depends on the peak wavelength of light emission spectrum of each color. The optical path lengths are each set so that the optical path length of the red unit region 11R is the longest, the optical path length of the blue unit region 11B is the shortest, and the optical path length of the green unit region 11G is middle.

There are various procedures of varying the optical path length of the microcavity structure 20 of each of the unit regions 11R, 11G, and 11B. From the viewpoint of reducing influence on a resistance value as much as possible, a procedure of varying the thickness of the hole injecting layer 14 is employed. When the thickness of the hole injecting layer 14 of the red unit region 11R is tHIL-R, the thickness of the hole injecting layer 14 of the green unit region 11G is tHIL-G, and the thickness of the hole injecting layer 14 of the blue unit region 11B is tHIL-B, for example, tHIL-R, tHIL-G, and tHIL-B are set so that tHIL-R is greater than tHIL-G and tHIL-G is greater than tHIL-B.

Due to the microcavity structure 20, light emitted from the organic layer 5 is repeatedly reflected between the first electrode 4 and the second electrode 6 within a predetermined optical path length range, light with a specific wavelength corresponding to the optical path length is resonated and enhanced, and light with a wavelength that does not correspond to the optical path length is weakened. Accordingly, the spectrum of light extracted to the outside is made steep, the spectral intensity thereof is increased, and the luminance and color purity are improved.

For materials constituting the light emitting layer 16, a light emitting material to emit red light may be used in the red unit region 11R, a light emitting material to emit green light may be used in the green unit region 11G, and a light emitting material to emit blue light may be used in the blue unit region 11B. In the case of the present embodiment, a bipolar material is used for the host material in all the unit regions.

For the dopant material, a phosphorescent material is used in the red unit region 11R and the green unit region 11G, and a fluorescent material is used in the blue unit region 11B. The thickness of the light emitting layer 16 in the red unit region 11R and the green unit region 11G is, for example, approximately 60 nm. The thickness of the light emitting layer 16 in the blue unit region 11B is, for example, approximately 35 nm.

Alternatively, one light emitting material to emit white light may be used in the light emitting area U of all the red unit region 11R, the green unit region 11G, and the blue unit region 11B. Even in this case, lights with different wavelengths in the unit regions 11R, 11G, and 11B are resonated and amplified. As a result, red light is emitted from the red unit region 11R, green light is emitted from the green unit region 11G, and blue light is emitted from the blue unit region 11B.

A cap layer 21 is layered on the upper face of the second electrode 6. The cap layer 21 functions as a protection layer for protecting the second electrode 6 and as an optical adjustment layer. Note that a color filter may be added on an upper-layer side of the second electrode 6. When the color filter transmits light emitted from the organic layer 5, the color purity can be enhanced.

A specific configuration example of the organic EL device 100 is given in Table 1.

TABLE 1

| | Red | Green | Blue |
|---|---|---|---|
| First electrode ITO: 120 nm | ITO: 120 nm | ITO: 120 nm | ITO: 120 nm |
| HIL Organic HTL material (80%):MoOx (20%) | 130 nm | 70 nm | 35 nm |
| HTL Organic HTL material | 10 | 10 | 10 |
| EML | H (90%):d (10%) | H (90%):d (10%) | H (90%):d (10%) |
| | 60 nm | 60 nm | 35 nm |
| | H: bipolar material | H: bipolar material | H: bipolar material |
| | d: phosphorescent material | d: phosphorescent material | d: fluorescent material |
| ETL organic ETL material + doping | 150 nm | 150 nm | 150 nm |
| Second electrode (ITO) | 70 nm | 70 nm | 70 nm |

EML H (host material), A (assist material), d (dopant material)

A description follows regarding a process for manufacturing the organic EL device 100 having the above configuration with reference to FIGS. 8A to 11B. FIGS. 8A to 11B illustrate one recessed portion structure.

Figure 8A:
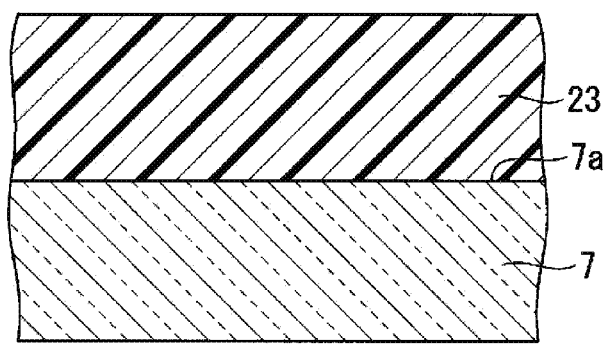
FIG. 8A is a view of a first step illustrating a method for manufacturing an organic EL device.

First, as illustrated in FIG. 8A, a positive-type photosensitive resin material is applied to an upper face 7a of the substrate 7 to form a resin layer 23.

Figure 8B:
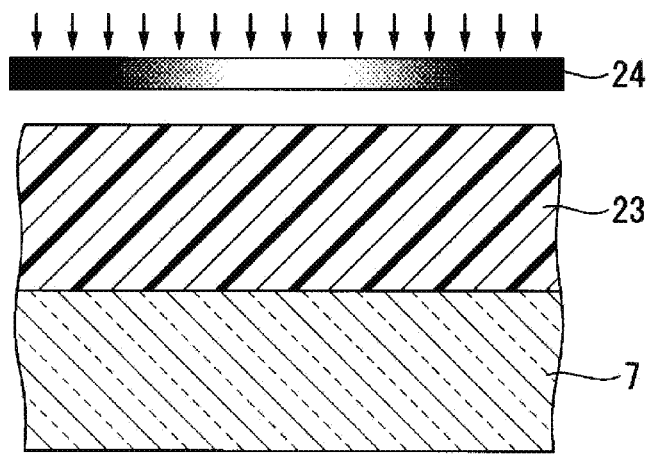
FIG. 8B is a view of a second step illustrating the method for manufacturing an organic EL device.

Next, as illustrated in FIG. 8B, the resin layer 23 is exposed with a photomask 24.

At this time, the photomask 24 having a predetermined optical transmission amount distribution is used, like a gray-tone mask. Specifically, the photomask 24 having higher optical transmission amount near the center of a circular pattern and optical transmission amount made lower toward peripheral portions is used. Thus, in the resin layer 23, the degree of exposure is higher near the center of the circular pattern, and the degree of exposure made lower toward the peripheral portions.

Figure 8C:
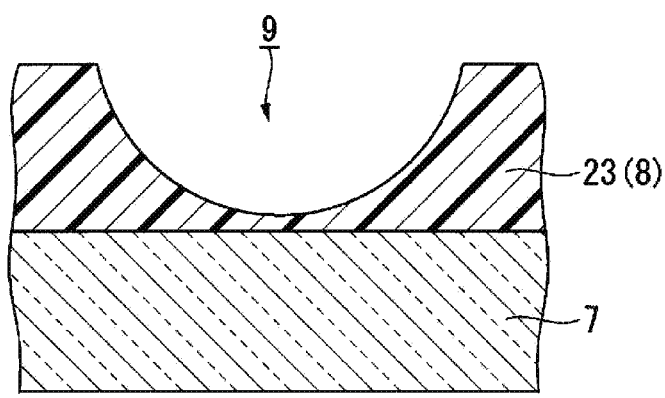
FIG. 8C is a view of a third step illustrating the method for manufacturing an organic EL device.

Next, as illustrated in FIG. 8C, the resin layer 23 is developed by using a predetermined developer. In accordance with the differences in the degree of exposure of the resin layer 23, the amount of film reduction of the resin layer 23 at this time is larger near the center of the circular pattern, and made smaller toward the peripheral portions. The recessed portion 9 having a circular arc cross-section profile is accordingly formed in the resin layer 23, to form the foundation layer 8.

Figure 8D:
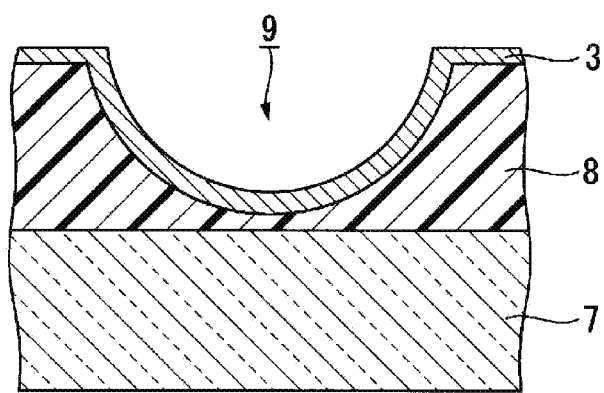
FIG. 8D is a view of a fourth step illustrating the method for manufacturing an organic EL device.

Next, as illustrated in FIG. 8D, a metal such as aluminum is vapor deposited on the entire surface of the foundation layer 8, and the reflective layer 3 is formed.

Next, three methods can be given as examples of methods for forming the filling layer 12.

A description follows regarding these methods for forming the filling layer 12.

A first method for forming the filling layer is as follows.

Figure 9A:
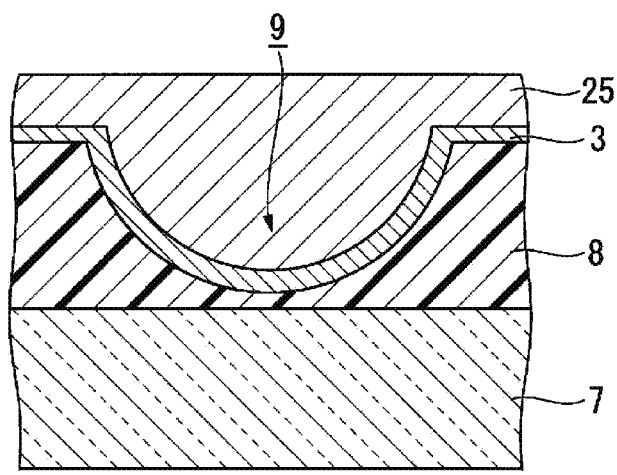
FIG. 9A is a view of a first step illustrating a first method for forming a filling layer in an organic EL device.

First, as illustrated in FIG. 9A, a resin film 25 formed from an acrylic, epoxy, or polyimide resin is formed on the entire surface of the reflective layer 3. The method for forming the resin film 25 includes, for example, applying a liquid resin material to the reflective layer 3 by using a method such as spin-coating or bar coating. At this time, the film thickness of the resin film 25 is set so that the resin film 25 fills the recessed portions 9, and also covers a planar portion of the reflective layer 3.

Figure 9B:
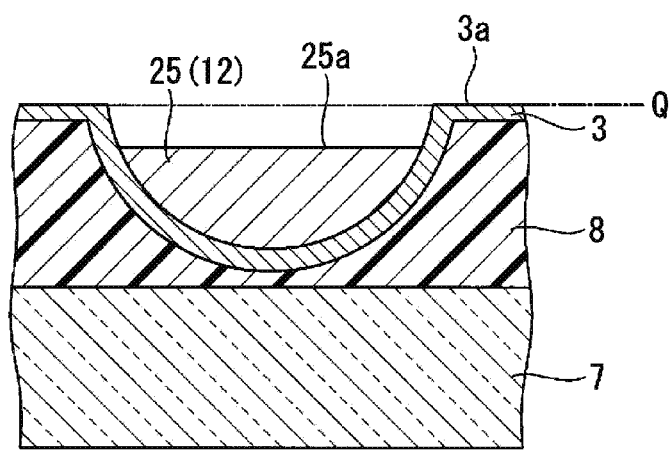
FIG. 9B is a view of a second step illustrating the first method for forming a filling layer in an organic EL device.

Next, as illustrated in FIG. 9B, the entire surface of the resin film 25 is etched back, for example, by using a method such as plasma ashing (dry ashing). At this time, the etch-back amount is adjusted so that an upper face 25a of the resin film 25 is positioned lower than the plane Q including the upper face 3a of the reflective layer 3. The filling layer 12 is thereby formed.

Figure 9C:
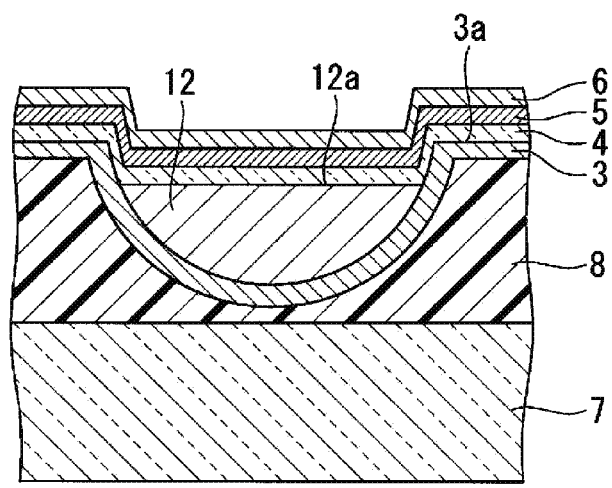
FIG. 9C is a view of a third step illustrating the first method for forming a filling layer in an organic EL device.

As illustrated in FIG. 9C, the first electrode 4, the organic layer 5, and the second electrode 6 are sequentially formed on the upper face 3a of the reflective layer 3 and the upper face 12a of the filling layer 12. The first electrode 4, the organic layer 5, and the second electrode 6 are formed by a known process. For example, a pattern may be formed by vacuum deposition using a shadow mask. There is no limitation thereto; a spray method, an inkjet method, a printing method, or a laser transfer method may be employed.

A second method for forming the filling layer is as follows.

Figure 10A:
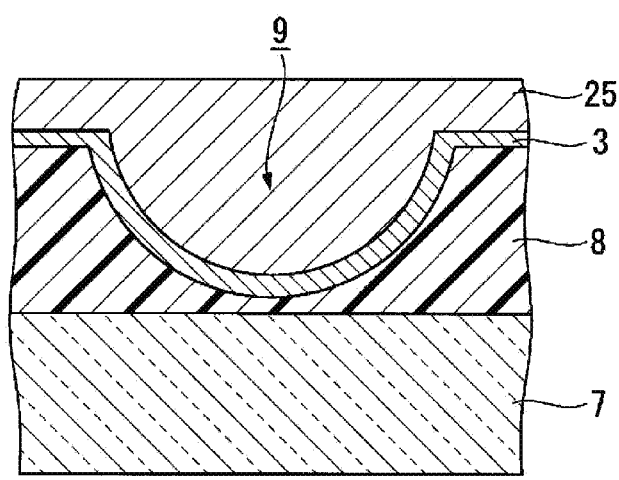
FIG. 10A is a view of a first step illustrating a second method for forming a filling layer in an organic EL device.

As illustrated in FIG. 10A, the resin film 25 formed from acrylic, epoxy, or polyimide is formed on the entire surface of the reflective layer 3. This process is the same as that of the first method for forming the filling layer illustrated in FIG. 9A.

Figure 10B:
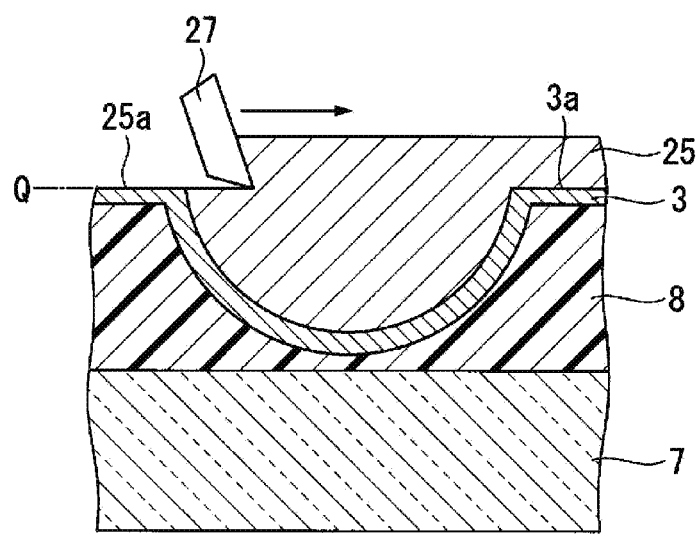
FIG. 10B is a view of a second step illustrating the second method for forming a filling layer in an organic EL device.

Next, as illustrated in FIG. 10B, the entire surface of the resin film 25 is leveled by using a squeegee 27. At this time, the squeegee 27 is moved along the upper face 3a of the reflective layer 3 so that after the squeegee 27 has passed, the upper face 25a of the resin film 25 is in the same plane as the plane Q including the upper face 3a of the reflective layer 3.

Figure 10C:
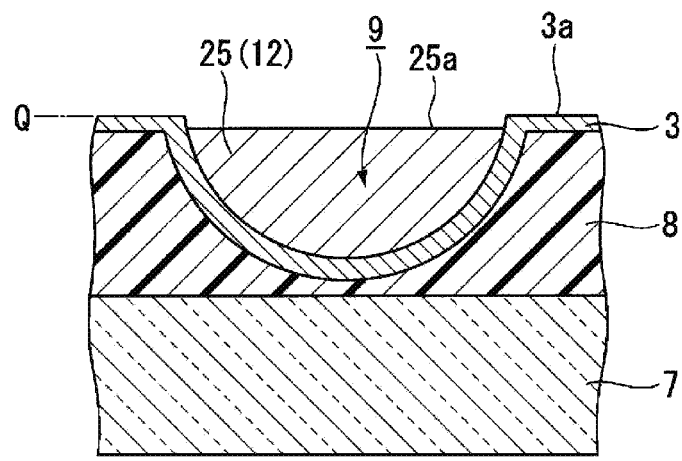
FIG. 10C is a view of a third step illustrating the second method for forming a filling layer in an organic EL device.

Next, as illustrated in FIG. 10C, the base material is baked with the resin film 25 remaining in the recessed portions 9.

The volume of the resin film 25 shrinks due to baking, and as a result, the upper face 25a of the resin film 25 is positioned lower than the plane Q including the upper face 3a of the reflective layer 3. The filling layer 12 is thereby formed.

The filling layer 12 can be formed by a method other than the forming methods described above, that includes exposure of the resin film 25 with a photomask, development, water-washing, and drying. The photomask has a pattern in which a region corresponding to the recessed portions 9 is shaded. Therefore, during exposure, the acrylic resin layer within the recessed portions 9 is highly exposed by collection of light in the recessed portions 9. This can prevent excess development of the filling layer. As the photomask, for example, a halftone mask may be used.

Figure 10D:
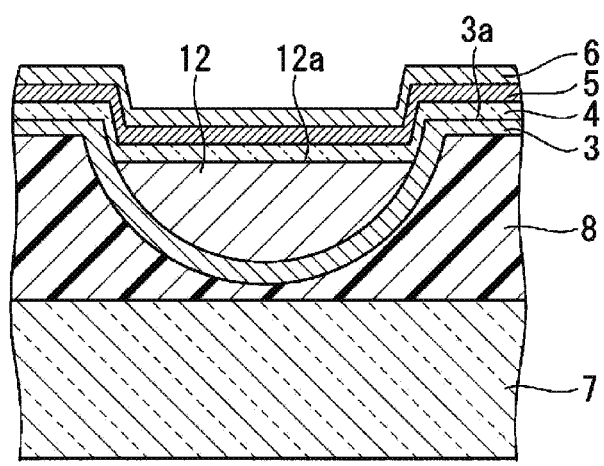
FIG. 10D is a view of a fourth step illustrating the second method for forming a filling layer in an organic EL device.

As illustrated in FIG. 10D, the first electrode 4, the organic layer 5, and the second electrode 6 are sequentially formed on the upper face 3a of the reflective layer 3 and the upper face 12a of the filling layer 12. This process is the same as that of the first method for forming the filling layer illustrated in FIG. 9C.

A third method for forming the filling layer is as follows.

Figure 11A:
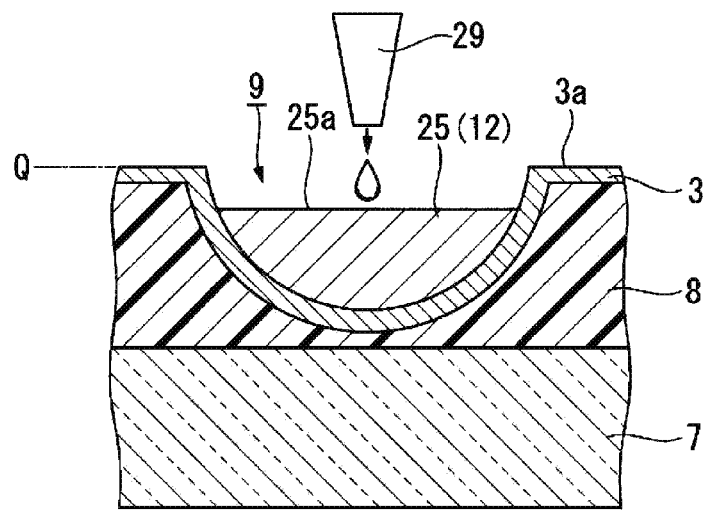
FIG. 11A is a view of a first step illustrating a third method for forming a filling layer in an organic EL device.

As illustrated in FIG. 11A, the resin film 25 formed from acrylic, epoxy, or polyimide is layered on the surface of the reflective layer 3 at the inside of the recessed portions 9. As the method for forming the resin film 25, for example, a resin material in a liquid drop state is applied to the reflective layer 3 by using a method such as ink jetting. At this time, the amount of resin material ejected from an inkjet head 29 is adjusted so that the upper face 25a of the resin film 25 is positioned lower than the plane Q including the upper face 3a of the reflective layer 3. The filling layer 12 is thereby formed.

Figure 11B:
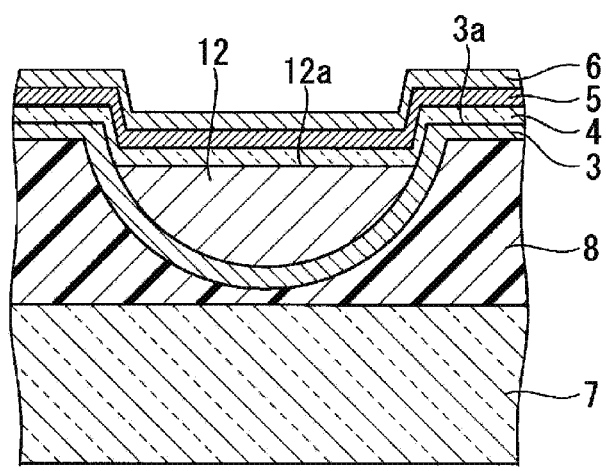
FIG. 11B is a view of a second step illustrating the third method for forming a filling layer in an organic EL device.

As illustrated in FIG. 11B, the first electrode 4, the organic layer 5, and the second electrode 6 are sequentially formed on the upper face 3a of the reflective layer 3 and the upper face 12a of the filling layer 12. This process is the same as that of the first method for forming the filling layer illustrated in FIG. 9C.

The organic EL device 100 of the present embodiment is completed by the process described above.

Figure 12A:
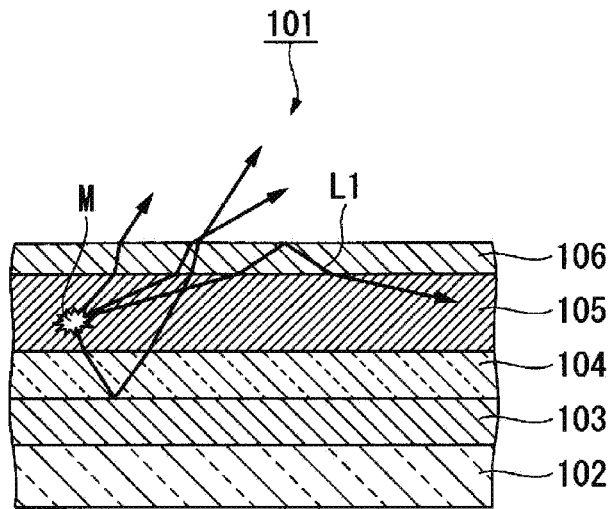
FIG. 12A is a cross-sectional view of a conventional organic EL device.

FIG. 12A is a cross-sectional view illustrating a conventional organic EL device 101.

The organic EL device 101 has a configuration in which a reflective layer 103, a first electrode 104, an organic layer 105, and a second electrode 106 are sequentially layered on a substrate 102. In the organic EL device 101, light emitted from the light emitting layer in the organic layer 105 is emitted uniformly in all directions, and advances through the interior while being refracted by interfaces between respective layers having different refractive indexes. Light that has advanced toward the substrate 102 side is reflected by the reflective layer 103.

Since there is a difference in refractive index at the interface between the second electrode 106 and the external space (air), light incident on this interface at a small angle of incidence is emitted to the external space, and light incident at a large angle of incidence is reflected by this interface and advances though the interior again. For example, light L1 emitted from an optional light-emission point M in the organic layer 105 in a direction close to a horizontal direction is unlikely to be emitted to the external space even when the angle is somewhat changed by refraction by an inter-layer interface.

Loss due to reflection of light at the interface between the second electrode 106 and the external space (air) does not occur on the path of light advancing through the interior of the organic EL device 101. In contrast thereto, since the reflectivity of metals constituting the reflective layer 103 is generally not 100%, loss due to reflection of light occurs at the interface between the first electrode 104 and the reflective layer 103. Moreover, some of the light is absorbed into respective films while advancing through the interior of the organic EL device 101. Accordingly, the light is attenuated while advancing through the interior of the organic EL device 101. The refractive index of the organic layer 105 is usually approximately 1.8. In this case, of the light emitted from the light emitting layer, the proportion of light extracted to the external space is approximately 20%. Thus, the known organic EL device 101 has a problem of low light utilization efficiency.

Figure 12B:
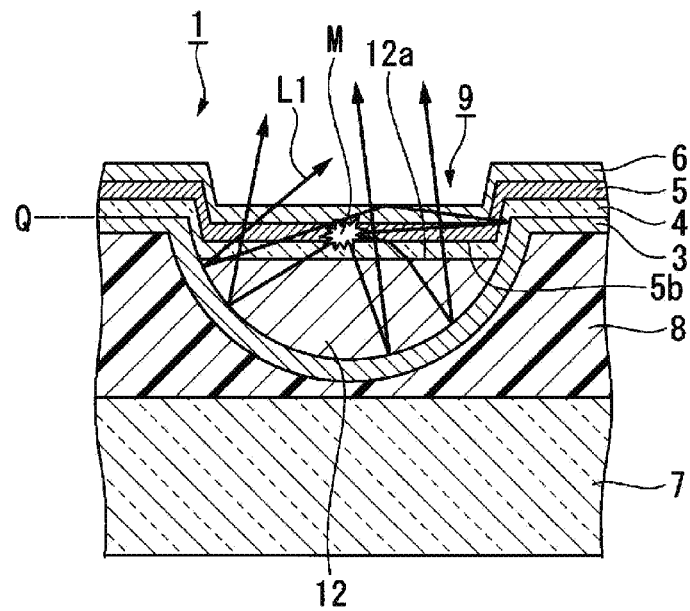
FIG. 12B is a cross-sectional view of the organic EL device according to the first embodiment.

In contrast, in the organic EL device 100 of the present embodiment, the advance direction of light reflected by the reflective layer 3 changes due to curve of the reflective layer 3 along the recessed portions 9, and the light advances through the interior of the organic EL device 100, as illustrated in FIG. 12B. At that time, due to reflection by the reflective layer 3, light having a large angle of incidence at the interface between the second electrode 6 and the external space (air) is converted into light having a smaller angle of incidence than a critical angle at the interface between the second electrode 6 and the external space, and then extracted to the external space.

Particularly, in the case of the present embodiment, as described above, the upper face 12a of the filling layer 12 is positioned lower than the plane Q including the upper face 3a of the reflective layer 3, and a lower face 5b of the organic layer 5 is also positioned lower than the plane Q. Therefore, the reflective layer 3 is present at a side of the organic layer 5 positioned inside each of the recess portions 9 (crosswise directions in FIG. 12B). Accordingly, for example, the light L1 emitted from the optional light-emission point M in the organic layer 5 in a direction close to a horizontal direction is reflected by the reflective layer 3 and the angle of the advance direction is changed. Unlike the known organic EL device 101 illustrated in FIG. 12A, even the light L1 emitted from the light-emission point M in the direction close to a horizontal direction is reflected by the reflective layer 3, and then enters the interface between the second electrode 6 and the external space at a smaller angle of incidence than the critical angle. At that time, light can be extracted to the external space. Thus, the organic EL device 100 having excellent light utilization efficiency can be provided.

Note that in the present embodiment, even light emitted from the light-emission point M in the organic layer 5 in the substantially horizontal direction can be incident on the reflective layer 3 because the upper face 12a of the filling layer 12 is positioned lower than the plane Q and the lower face 5b of the organic layer 5 is also positioned lower than the plane Q. However, in a case where the upper face 12a of the filling layer 12 is in-plane with the plane Q, the lower face 5b of the organic layer 5 would be positioned higher than the plane Q. In this case, light emitted from the light-emission point M in the organic layer 5 in the substantially horizontal direction would not be incident on the reflective layer 3 because the reflective layer 3 is not present at the side of the organic layer 5 positioned inside each of the recessed portions 9. However, the proportion of light that is emitted from the light-emission point M in the organic layer 5 within a predetermined angle range close to the horizontal direction and enters the reflective layer 3 is sufficiently increased as compared to the known organic EL device 101. Accordingly, even in this configuration, an organic EL device having excellent light utilization efficiency can be provided.

Figure 13A:
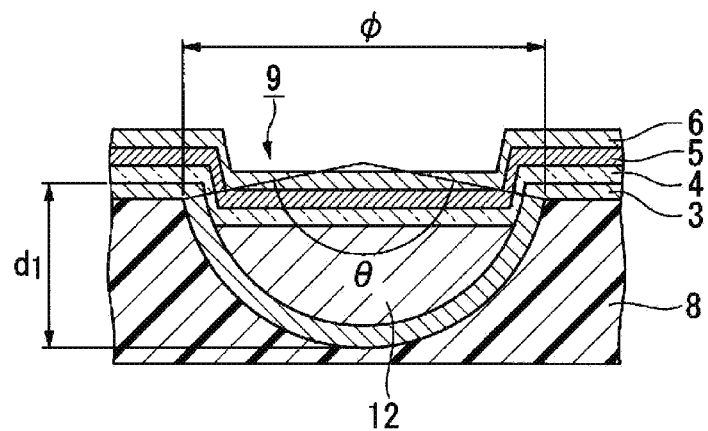
FIG. 13A is a first view illustrating a parameter showing the depth of a recessed portion.
Figure 13B:
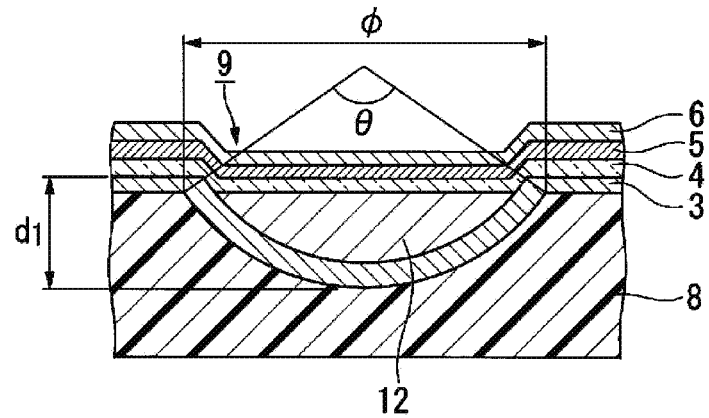
FIG. 13B is a second view illustrating the parameter showing the depth of the recessed portion.

FIGS. 13A and 13B are views illustrating a parameter of depth of each of the recessed portions.

In the present embodiment, as a parameter of depth of the recessed portions 9, a central angle of a circular arc that is the cross-sectional shape of the recessed portions 9 is used.

As illustrated in FIGS. 13A and 13B, the diameter φ of a circle of the recessed portions 9 as viewed in plan view is made constant, and the cross-sectional shape of the recessed portions 9 is defined as a circular arc. Therefore, the depth d1 of the recessed portions 9 indicates the central angle θ of the circular arc. Accordingly, as the depth d1 of the recessed portions 9 is larger, the central angle θ is larger, and as the depth d1 of the recessed portions 9 is smaller, the central angle θ is smaller.

In the present embodiment, light emitted under an electrical field is UV light or blue light as described above. However, most of light is emitted to the outside through the filling layer 12. Therefore, light emitted to the outside by excitation of a phosphor contained in the filling layer 12 is a light emitting component of the phosphor. In light emission of the phosphor, light is usually emitted uniformly in all directions. However, the light emitting component is guided by the recessed portion structure according to one aspect of the disclosure, and emitted to the outside, but not sealed.

Even when in the organic EL device 100 of the present embodiment, the light emitting area U in each of the unit regions 11 is decreased, high luminance can be achieved due to the recessed portion structure provided in the light emitting area U. Even when the light emitting area U is small, required luminance can be achieved. Therefore, the load on the light emitting element can be decreased and power consumption can be decreased. Therefore, the lifetime of the element is increased.

For verification of effects of the organic EL device 100 of the present embodiment, the inventors of the disclosure manufactured a device having an organic EL element (with a recessed portion structure) in a unit region as Example, and a device having an organic EL device (without a recessed portion structure) in a unit region as Comparative Example. The light emitting efficiency of the devices were compared. As a light-emitting material, a green light-emitting material was used.

The results are as shown in Table 2. Hereinafter, the results will be described.

TABLE 2

| | Light emitting element I | Light emitting element II |
|---|---|---|
| Transmittance of element | 68% | 71% |
| Current efficiency (cd/A) | 170 | 88 |
| Element lifetime T90 at 1000 cd/m$^2$ | 2000 h (Substantial light emission luminescence: 50490 nit) | 1050 h (Substantial light emission luminescence: 10980 cd/m$^2$) |

The luminance of each device described later is a luminance obtained in 2-mm square display region 10.

In the organic EL device in Example, the light transmittance was 68%, the current efficiency was 170 cd/A, and the element lifetime was 2000 h (substantial light emission luminescence: 50490 nit).

In the organic EL device in Comparative Example, the light transmittance was 71%, the current efficiency was 88 cd/A, and the element lifetime was 1050 h (substantial light emission luminescence: 10980 nit).

An actual light emitting area U in each device is 9.1% of the display region 10. Therefore, the light emission luminescence in the light emitting area requires a light emission intensity of a transmissive area.

In the organic EL device in Example, the area of a 100-μm square unit region 11 is 10000 μm$^2$. A non-transmissive region of the unit region is a 30-μm square light emitting area U having the reflective layer 3. The area thereof is 900 μm$^2$. In contrast, a transmissive region (transmissive area T) is a region except for the non-transmissive region (light emitting area U), and the area thereof is 100 μm$^2$. Since the transmissive area T is a region other than the light emitting area U having the reflective layer 3, a portion where a first electrode 4 and a second electrode 6 that are formed from ITO, and an organic layer are layered has light transparency. The light transmittance in the transmissive area T is 78%.

Therefore, the light transmittance in the unit region 11 is 71% calculated by 9100×0.78/10000. Light emitted in the unit region 11 is radiated only above the substrate.

In this Example, a light emitting element having high light transmittance can be manufactured. Therefore, a light emitting element that can achieve high light transmittance without a recessed portion structure can be manufactured. However, the presence of the recessed portion structure can achieve not only increase in luminescence by high transmittance, but also decrease in power consumption and increase in element lifetime.

When the light emitting area U is decreased to realize a transparent display, the luminance required in a unit region is increased. When a front luminance of 100 nit is obtained by the configuration of this Example, a luminance of 1098 nit calculated by 100 nit/9.1% is required for the element as compared with emission of light in the whole 100-μm square unit region. This is because the actual light emitting area U in the unit region 11 is a 30-μm square, and the proportion of the light emitting area U was 9.1%.

Since the organic EL device in this Example has a recessed portion structure as described above, the front luminance in this Example is twice that of known configuration without a recessed portion structure, and the required luminance is 549 nit. Since the required luminance is decreased to a half, the power consumption is also decreased to a half. Since the element lifetime luminance is proportional to the square of luminance, the element lifetime during light emission at 100 nit is about four times.

This shows that the configuration in this Example largely improves the current efficiency and the element lifetime.

The region other than the light emitting area U in the unit region 11 is substantially colorless and transparent. Therefore, in this colorless and transparent region, a substance positioned behind the organic EL device 100 can be sufficiently visually recognized. Accordingly, the organic EL display can sufficiently exert a function of a transparent display.

Second Embodiment

Next, a description follows regarding an organic EL device of a second embodiment of the disclosure.

A basic configuration of the organic EL device of the present embodiment as described later is substantially the same as that of the first embodiment except that a contact portion between an active element and each wiring line is a light emitting area. In the following description, portions different from the embodiment described above will be described in detail. The description of common point will be omitted. In each drawing used in the description, components that are the same as those in FIGS. 1 to 13B will be assigned the same reference numerals.

Figure 14:
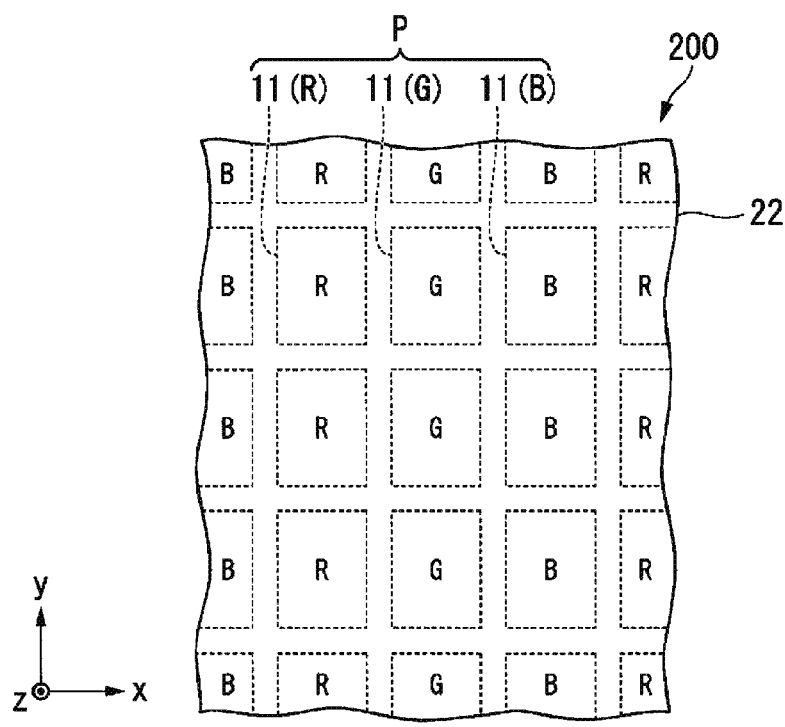
FIG. 14 is a plan view of a portion of a display region in an organic EL element according to a second embodiment.

FIG. 14 is a plan view of a portion of a display region in an organic EL element of the second embodiment.

Figure 15:
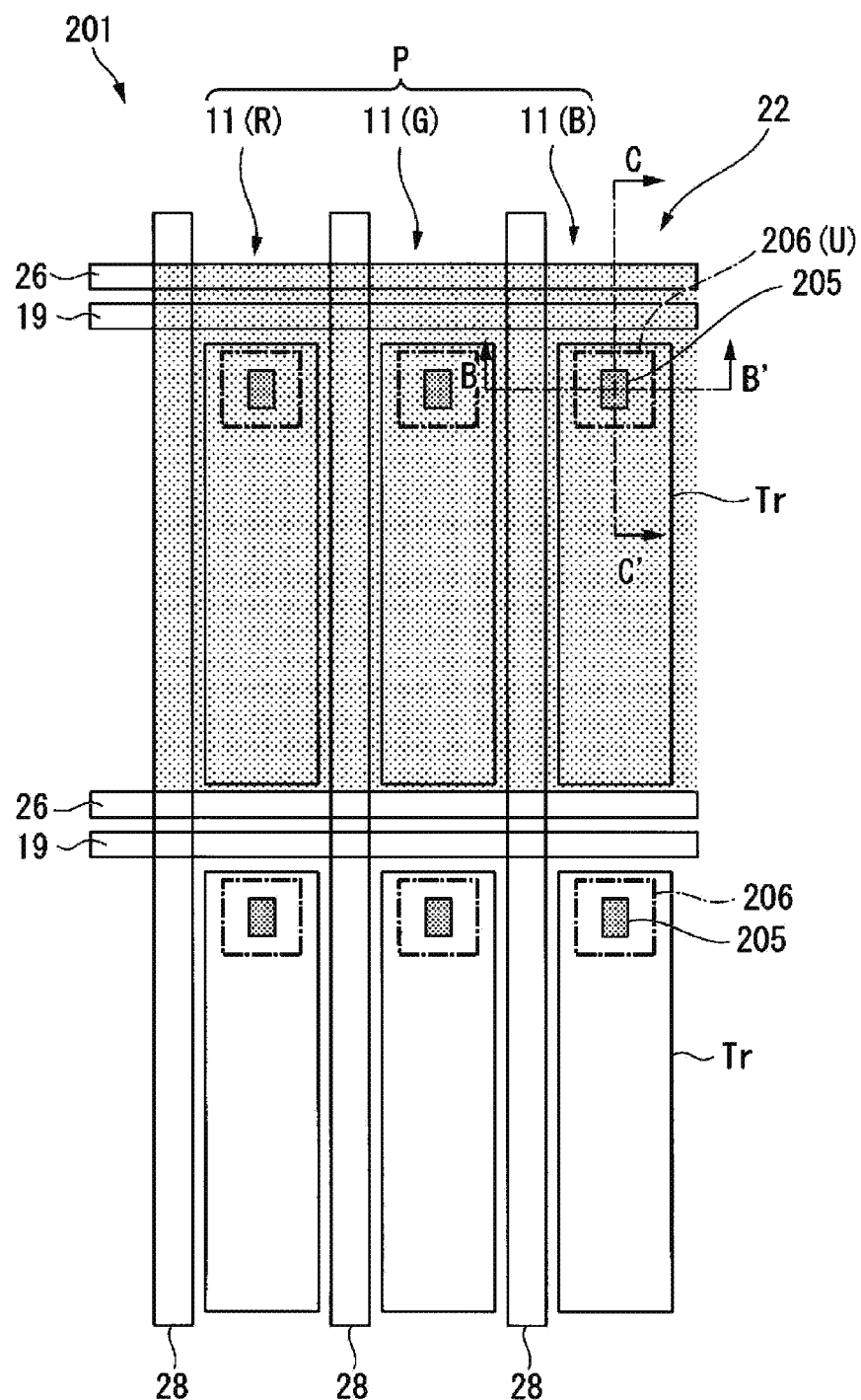
FIG. 15 is a plan view illustrating a configuration of each pixel in the organic EL element according to the second embodiment.

FIG. 15 is a plan view illustrating a configuration of each pixel in the organic EL element of the second embodiment.

Figure 16A:
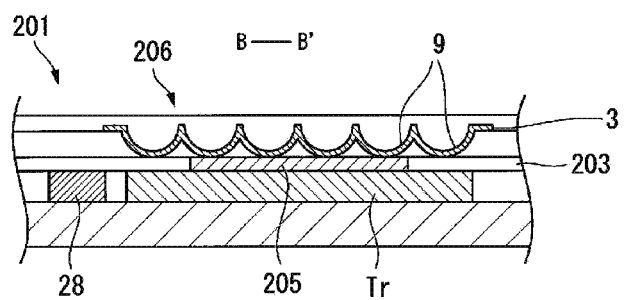
FIG. 16A is a cross-sectional view taken along line B-B' in FIG. 15.
Figure 16B:
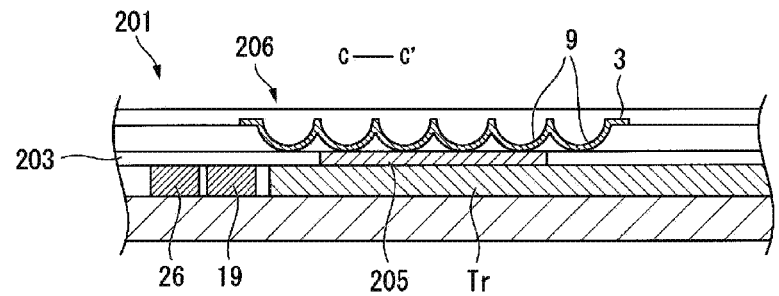
FIG. 16B is a cross-sectional view taken along line C-C' in FIG. 15.
Figure 17:
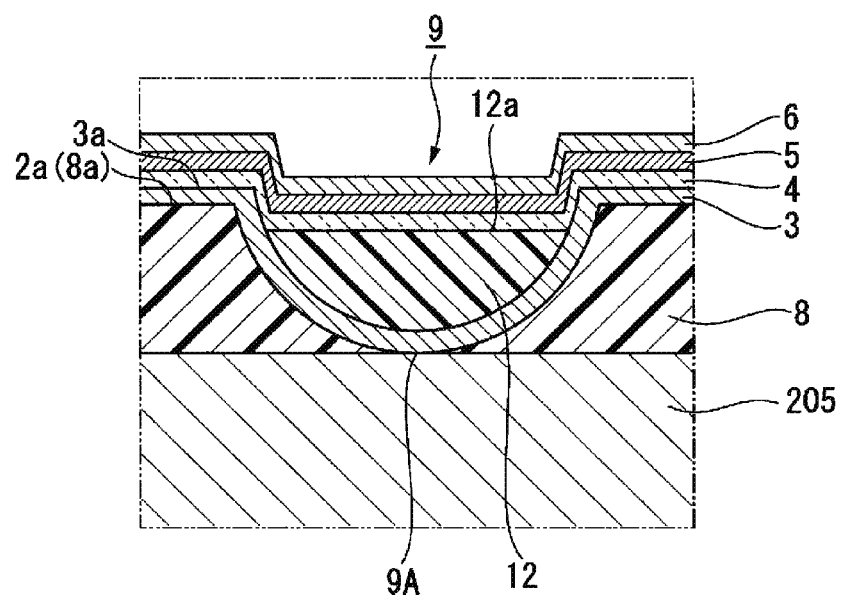
FIG. 17 is an enlarged cross-sectional view of a main portion in a light emitting element portion.

FIG. 16A is a cross-sectional view taken along line B-B' in FIG. 15, and FIG. 16B is a cross-sectional view taken along line C-C' in FIG. 15. FIG. 17 is an enlarged cross-sectional view of a main portion in a light emitting element portion.

As illustrated in FIG. 14, an organic EL device (display device) 200 of the present embodiment is a display device having a display region 22 in which a plurality of pixels Ps are arranged in a matrix. The pixels Ps each include three sub pixels (unit regions) 11 of RGB arranged in turn in a crosswise direction of the display region 22. A red sub pixel 11R emits red light, a green sub pixel 11G emits green light, and a blue sub pixel 11B emits blue light. The red sub pixel 11R, the green sub pixel 11G, and the blue sub pixel 11B have the same configuration except that fluorescent materials contained in the filling layers are different. Each of the pixels Ps has a size of 120-μm square.

Each of the red sub pixel 11R, the green sub pixel 11G, and the blue sub pixel 11B can be independently driven (application of electrical field). As a procedure for independently applying a voltage to the sub pixels, an optional procedure using a simple matrix electrode, segment division, or an SW substrate such as a TFT can be performed.

In the present embodiment, one pixel is divided into three sub pixels 11, and each of the sub pixels 11 is independently driven. An optional color can be displayed according to a method for emitting light in each of the sub pixels 11.

As illustrated in FIG. 15, the organic EL device 200 of the present embodiment includes a display panel including an active matrix substrate 201, a plurality of thin film transistors (active elements) Tr that are provided in an predetermined arrangement corresponding to the plurality of sub pixels 11 in the display region 22, various wiring lines connected to each of the thin film transistors Tr, and a sealing substrate (not illustrated) configured to cover the plurality of thin film transistors Tr and the wiring lines.

In the active matrix substrate 201, a plurality of gate lines (scanning lines) 28 that extend in parallel, a plurality of source lines (data lines) 19 that extend in parallel in a direction intersecting each of the gate lines 28, and a plurality of current-supplying wiring lines 26 that extend along the source lines 19 are provided in the display region 22 as a drive circuit for driving the display panel. Herein, the gate lines 28 and the source lines 19 are insulated from each other, and totally formed in a lattice so that each of the sub pixels 11 is configured.

The gate lines 28, the source lines 19, and the current-supplying wiring lines 26 are formed in a width of 3 μm from a metal layer of Ti/Al/Ti. Each wiring line portion is a non-transmissive region.

At each intersection between the gate lines 28 and the source lines 19, each of the thin film transistors (active elements) Tr for switching that is electrically connected is provided. As the thin film transistors Tr, publicly known thin film transistors can be employed. In the present embodiment, a configuration 2Tr1C including two thin film transistors Tr and one capacitor is used. In the present embodiment, for example, a bottom gate type transistor is employed.

In the present embodiment, a semiconductor film of each of the thin film transistors Tr can be formed from an oxide semiconductor. For example, the semiconductor film may contain at least one metal element of In, Ga, and Zn. In the present embodiment, the semiconductor film contains, for example, an In—Ga—Zn—O-based semiconductor. Herein, the In—Ga—Zn—O-based semiconductor is a ternary oxide consisting of indium (In), gallium (Ga), and zinc (Zn). The ratio (composite ratio) of In, Ga, and Zn is not particularly limited, and for example, includes In:Ga:Zn of 2:2:1, 1:1:1, or 1:1:2. Such an oxide semiconductor film may be formed from an oxide semiconductor film including the In—Ga—Zn—O-based semiconductor. When a transparent oxide semiconductor is used, a portion of the thin film transistor Tr can be a transmissive region.

A channel etching TFT having an active layer containing the In—Ga—Zn—O-based semiconductor is sometimes referred to as "CE-InGaZnO-TFT". The In—Ga—Zn—O-based semiconductor may be amorphous or crystalline. It is preferable that a crystalline In—Ga—Zn—O-based semiconductor be a crystalline In—Ga—Zn—O-based semiconductor in which a c axis is oriented so as to be generally vertical to a layer face.

In the embodiment described above, the semiconductor film of each of the thin film transistors Tr that is formed from a compound (In-GA-Zn—O) containing indium (In), gallium (Ga), zinc (Zn), and oxygen (O) is described. However, the disclosure is not limited to the embodiment. A semiconductor layer of each of the thin film transistors Tr may be formed from a compound (In-Tin-Zn—O) containing indium (In), tin (Tin), zinc (Zn), and oxygen (O), or a compound (In—Al—Zn—O) containing indium (In), aluminum (Al), zinc (Zn), and oxygen (O). The semiconductor film of each of the thin film transistors Tr may be formed from an amorphous silicon, a low-temperature polysilicon, or the like.

The contact portion 205 is formed in an interlayer insulating layer 203 that covers each of the thin film transistors Tr and various wiring lines. The contact portion 205 is a portion where each thin film transistor Tr is electrically connected to the source line 19. The contact portion 205 is a non-transmissive region that has a 20-μm square as viewed in plan view.

The light emitting element portion (light emitting element) 206 is formed so as to include the plurality of recessed portions 9 formed in the resin layer. The light emitting element portion 206 is configured to have the reflective layer 3, the filling layer 12, the first electrode 4, the organic layer 5, and the second electrode 6. In the present embodiment, an opening 9A is provided on a bottom side of each of some recessed portions 9 positioned above the contact portion 205. The contact portion 205 on a lower layer side is electrically connected to the reflective layer 3 through the opening 9A.

The light emitting element portion 206 has a size of 30-μm square as viewed in a plan view. The organic layer 5 emits light with color of the corresponding sub pixel 11.

The first electrode 4 is formed in a 30-μm square that has the substantially same size as that of the reflective layer 3. Similar to the embodiment described above, the first electrode 4 is in contact with a portion of the reflective layer 3.

According to the configuration of the present embodiment, the thin film transistors Tr are each electrically connected to the light emitting element portion 206 through the reflective layer 3 and the contact portion 205. The light emitting element portion 206 can emit light through each of the thin film transistors Tr.

Next, the light transmittance in a sub pixel unit in the present embodiment will be described.

"Area of sub pixel": 120 μm in length×40 μm in width=4800 μm$^2$

"Area of non-transmissive region": 1500 μm$^2$

Source line 19 and current-supplying wiring line 26: 3 μm in width×2×40 μm=240 μm$^2$ Gate line 28: 3 μm in width×1×120 μm=240 μm$^2$ Contact portion 205: 30 μm in length×30 μm in width=900 μm$^2$ The transmittance of the sub pixels 11 including the transmittance of the transparent electrode, the thin film transistor, and the other portions is 85%. The whole transmittance including the non-transmissive region is 60%.

In the organic EL device 200 of the present embodiment, the optical transmittance of the sub pixels 11 is 57%. Even when the thin film transistors Tr are configured as the active elements, the light emitting element having a transmittance of 56% can be realized. As compared with an element without a recessed portion structure, the light emitting efficiency of the organic EL device 200 of the present embodiment is twice, and the lifetime thereof is four times.

In the present embodiment, the contact portion 205 that is the non-transmissive area and a periphery thereof are covered with the light emitting element portion 206. Therefore, the non-transmissive area can be changed to the light emitting area U. The light emitting element portion 206 of the present embodiment can emit light with high luminance due to the recessed portion structure described above. Therefore, the light emitting area U within the sub pixels 11 can be decreased. A non-emissive area that is generated by decreasing the light emitting area U is the transmissive area T. Thus, a transmissive display can be realized. In the present embodiment, the light-emitting efficiency of the light emitting element portion 206 is not less than twice that of a known structure that does not include the recessed portion structure. Therefore, even when the light emitting area U within the sub pixels 11 is decreased, the luminance of the display can be maintained.

Third Embodiment

Figure 18:
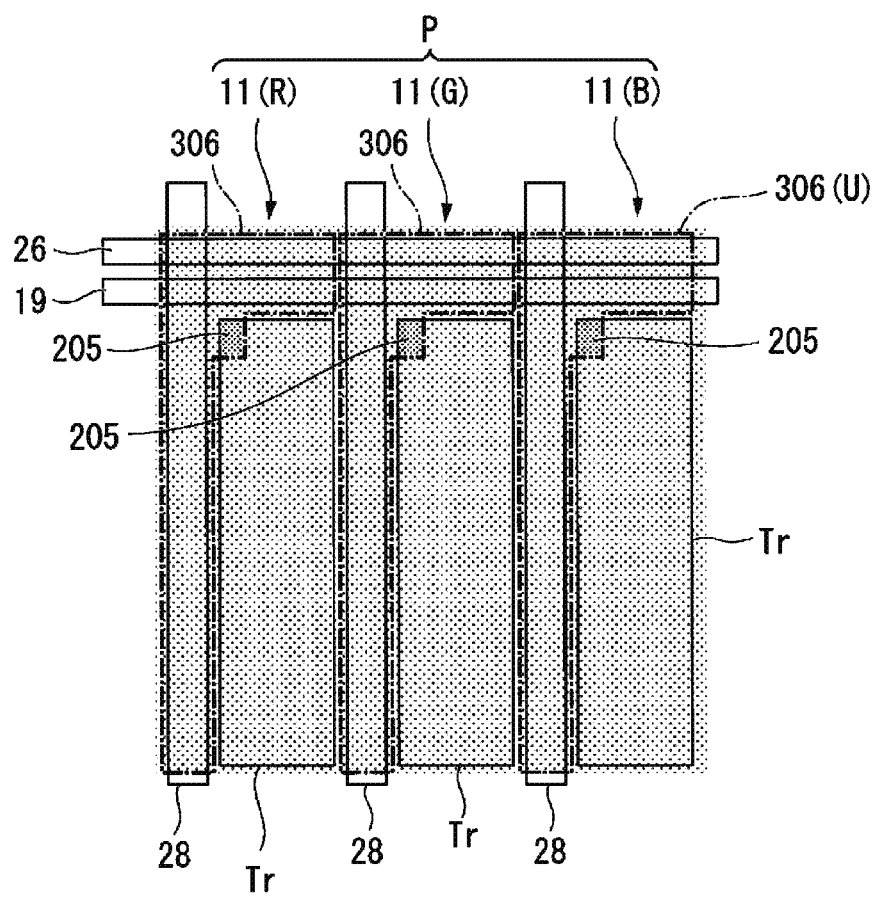
FIG. 18 is a view of a portion of a display region of an organic EL device according to a third embodiment.

A description follows regarding an organic EL device of a third embodiment of the disclosure with reference to FIG. 18.

A basic configuration of the device of the present embodiment as described later is substantially the same as that of the second embodiment except that a sub pixel is provided so as to overlap various types of wiring lines. In the following description, a point different from the second embodiment will be described in detail. The description of common point will be omitted. In each drawing used in the description, components that are the same as those in FIGS. 14 to 17 will be assigned the same reference numerals.

FIG. 18 is a plan view of a portion of a display region of an organic EL device according to a third embodiment.

As illustrated in FIG. 18, in the organic EL device of the present embodiment, a light emitting element portion (light emitting element) 306 is formed so as to overlap not only the contact portion 205 with the thin film transistors Tr, but also the gate lines 29, the source lines 19, and the current-supplying wiring line 26.

Since the various wiring lines include a metal wiring line, a region where the wiring lines are formed is a non-transmissive area. Therefore, when the light emitting element portion 206 is provided so as to cover the non-transmissive area where the wiring lines are formed, the non-transmissive area can be changed to the light emitting element U.

In the present embodiment, each sub pixel 11 is a region including the light emitting element 306 that covers the contact portion 205 and the wiring lines. The area of the sub pixel 11 can be made larger than that of the sub pixel 11 in the organic EL element of the second embodiment.

The light transmittance in a sub pixel unit in the present embodiment will be described.

"Area of sub pixel": 120 µm in length×40 µm in width=4800 µm$^2$

"Area of non-transmissive area": 1140 µm$^2$

Source line 19 and current-supplying wiring line 26: 4 µm in width×2×35 µm in length=280 µm$^2$ Gate line 28: 4 µm in width×115 µm in length=460 µm$^2$ Contact portion: 20 µm in length×20 µm in width=400 µm$^2$ According to the configuration of the present embodiment, the light emitting element portion 306 is formed on the non-transmissive area as described above. Therefore, the non-transmissive area is similar to a light emitting area.

The area of the light emitting area U is 4800 µm$^2$-1140 µm$^2$=3660 µm$^2$. The transmittance thereof is 85%. The whole transmittance is calculated by 3660 µm$^2$×0.85/4800 µm$^2$ to be 65%.

The light emission area of the light emitting element portion 306 in the present embodiment is 1140 µm$^2$. This light emission area is 1.27 times that of the light emitting element portion 206 in the second embodiment that is 900 µm$^2$. Therefore, the luminance of the sub pixels 11 can be enhanced. The load on the element to exhibit required luminance is decreased, and the element lifetime is increased.

According to the configuration of the present embodiment, the current in each sub pixel 11 required for the same luminance in the second embodiment is 80% of the current in the second embodiment. The element lifetime under the same luminance is 1.5 times.

According to the configuration of the present embodiment, the current efficiency and the element lifetime can be improved as compared with the configuration of the second embodiment.

Fourth Embodiment

A description follows regarding an organic EL device of a fourth embodiment of the disclosure.

A basic configuration of the organic EL device of the embodiment described later is substantially the same as that of the second embodiment except that an organic EL element that emits white light is provided and a color filter substrate is provided. In the following description, a portion different from the embodiment described above will be described in detail. The description of common point will be omitted. In each drawing used in the description, components that are the same as those in FIGS. 14 to 17 will be assigned the same reference numerals.

Figure 19:
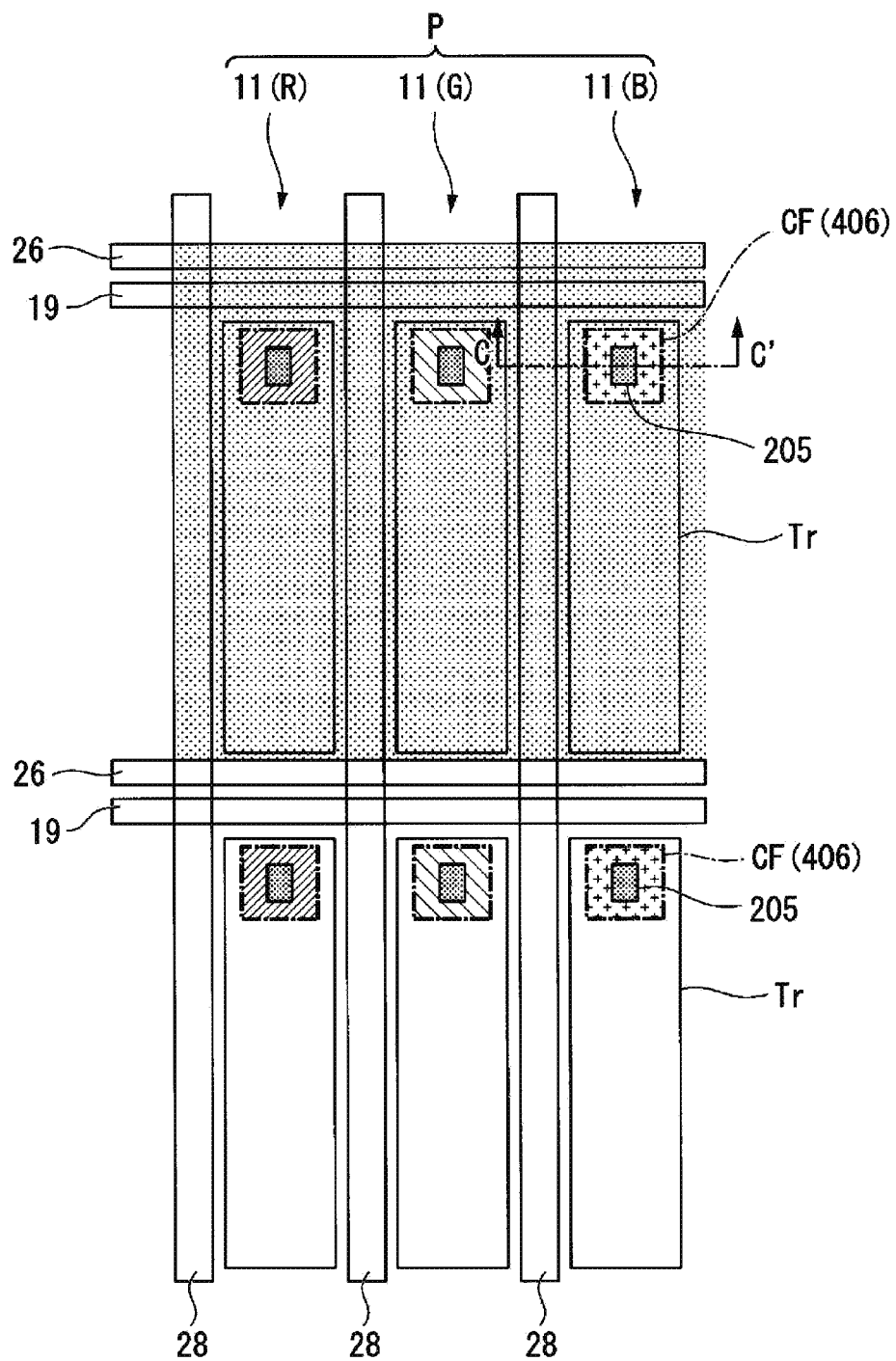
FIG. 19 is a view of a display region of an organic EL device according to a fourth embodiment.
Figure 20:
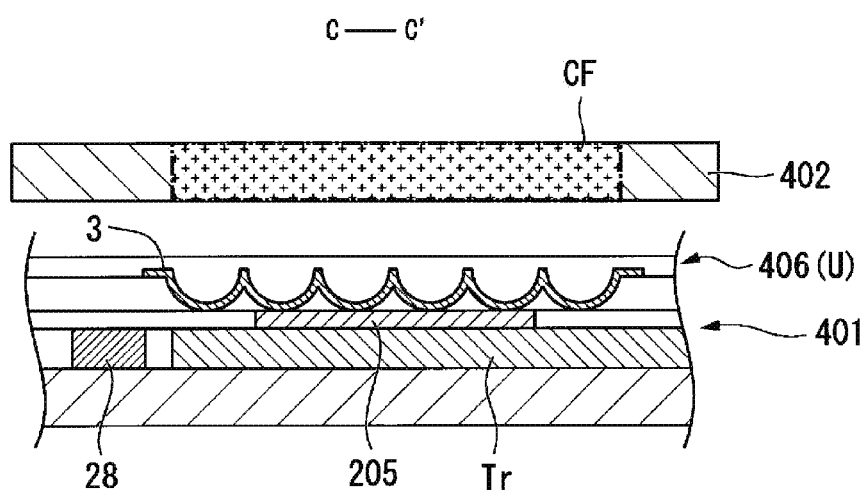
FIG. 20 is a cross-sectional view taken along line C-C' in FIG. 19.

FIG. 19 is a view of a display region of the organic EL device of the fourth embodiment. FIG. 20 is a cross-sectional view taken along line C-C' in FIG. 19.

As illustrated in FIGS. 19 and 20, the organic EL element of the present embodiment includes an active matrix substrate 401 including a thin film transistor Tr that corresponds to each of the sub pixels 11 and has a transparent semiconductor layer, and a white light emitting element portion (light emitting element) 406, and a color filter substrate 402 that has a color filter CF of each color corresponding to the sub pixels 11.

The color filter substrate 402 includes a color filter CF of RGB corresponding to the sub pixel 11 of each color. The color filter CF of each color is disposed on the light emitting element portion 406, and has such a size that the light emitting element portion 406 is covered. The area of each of the color filters CFs is substantially the same as that of a region where the reflective layer 3 is set.

In the present embodiment, the color filter substrate 402 is produced separately from the active matrix substrate 402, and the active matrix substrate 401 and the color filter substrate 402 are bonded, to obtain the organic EL device.

A production method is not limited to the method described above. The organic EL device may be produced, for example, by forming a protection layer on the light emitting element portion 406 and forming the color filters CFs on the protection layer by application.

Alternatively, the color filter CF may be produced by forming a mask pattern through vapor deposition.

The light emitting element portion 406 is a white light emitting element that emits white light. The light emitting element portion 406 is formed on a plurality of recessed portions 9.

Next, a configuration of the white light emitting element portion 406 will be described in detail.

The light emitting element portion 406 of the present embodiment has an organic layer 35 that emits white light in each of the recessed portions 9. The organic layer 35 that emits white light is configured to have a first light emitting unit (EMU1) 39B that emits blue light, and a second light emitting unit (EMU2) 39RG that emits green and red light.

The organic layer 35 that emits white light is configured to have the first light emitting unit (EMU1) 39B that emits blue light, and the second light emitting unit (EMU2) 39RG that emits green and red light.

Figure 21A:
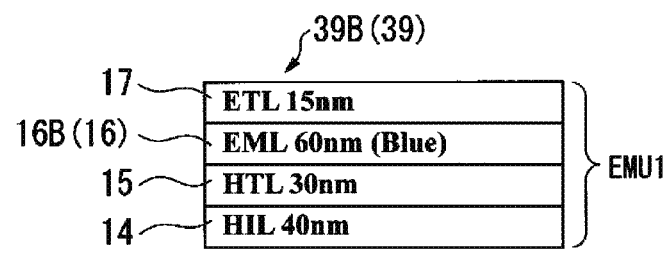
FIG. 21A is a view illustrating a configuration of a blue light emitting unit.
Figure 21B:
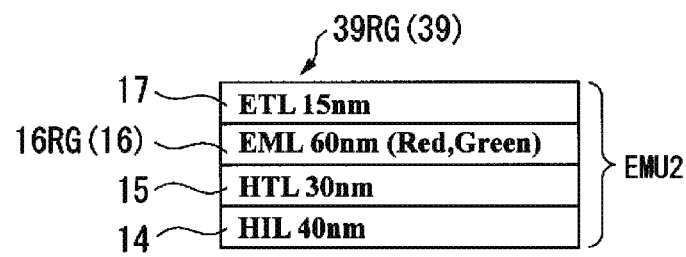
FIG. 21B is a view illustrating a configuration of a green and red light emitting unit.
Figure 21C:
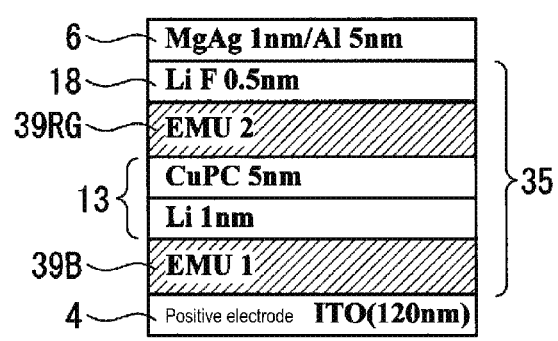
FIG. 21C is a view illustrating a configuration of a light emitting element portion that emits white light.

FIG. 21A is a view illustrating a configuration of a blue light emitting unit. FIG. 21B is a view illustrating a configuration of a green and red light emitting unit. FIG. 21C is a view illustrating a configuration of a light emitting element portion that emits white light.

In the present embodiment as illustrated in FIGS. 21A and 21B, a light emitting unit (EMU) 19 has a structure in which a hole injecting layer (HIL) 14 with a film thickness of 40 nm, a hole transport layer (HTL) 15 with a film thickness of 30 nm, a light emitting layer (EML) 16 with a film thickness of 60 nm, and an electron transport layer (ETL) with a film thickness of 15 nm are layered.

In the present embodiment, the first light emitting unit (EMU1) 39B having a blue light-emitting layer 16B in which a blue light-emitting material is doped, as illustrated in FIG. 21A, and the second light emitting unit (EMU2) 39RG having a green light-emitting layer 16G in which a green light-emitting material is doped and a red light-emitting layer 16R in which a red light-emitting material is doped are provided, as illustrated in FIG. 21B.

In the second light emitting unit 39RG, the green light-emitting layer 16G and the red light-emitting layer 16R are layered in this order.

As illustrated in FIG. 21C, the light emitting element portion 406 including the organic layer 35 that emits white light in each of the recessed portions 9 includes both the blue light emitting unit and the red and green light emitting unit. Thus, emission of white light can be achieved.

The light emitting element portion 406 of the present embodiment has a configuration in which the first light emitting unit 39B, a lithium (Li) layer, a copper phthalocyanine complex (CuPC) layer, the second light emitting unit 39RG, a lithium fluoride (LiF) layer, and the second electrode 6 are layered in this order on the first electrode 4 in each of the recessed portions 9. As a charge generating layer 13, the lithium (Li) layer with a film thickness of 1 nm and the copper phthalocyanine complex (CuPC) layer with a film thickness of 5 nm are provided. The first light emitting unit 39B and the second light emitting unit 39RG are layered in two layers with the charge generating layer 13 as an intermediate layer.

The first electrode 4 is formed from an ITO with a film thickness of 120 nm. A lithium fluoride (LiF) layer with a film thickness of 0.5 nm functions as the electron injecting layer 18.

Figure 22:
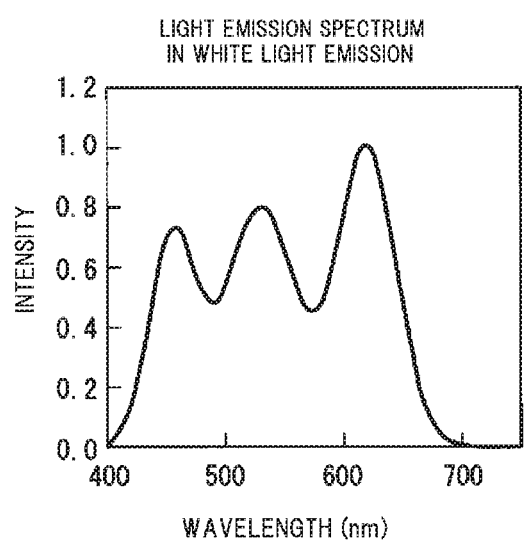
FIG. 22 is a graph illustrating a light emission spectrum in the light emitting element portion that emits white light.

FIG. 22 is a graph illustrating a light emission spectrum in the light emitting element portion that emits white light. Herein, Al of the second electrode 6 in the light emitting element portion 406 has a film thickness of 100 nm.

In the present embodiment, a microcavity effect due to the recessed portion structure is not obtained. Therefore, the light emission spectrum illustrated in FIG. 22 exhibits a basic property.

In the present embodiment, the color filters CFs are each provided on the light emitting element portion 406 that emits white light. Thus, a color display element is produced. In a high-resolution display having a precision of greater than 400 ppi, it is difficult to form each organic EL element of RGB in each of sub pixels by separative application. On the other hand, the precision of each of the color filters CFs can be up to approximately 600 ppi. According to the configuration of the present embodiment, a display with high precision can be obtained.

In general, the transmittance is significantly decreased due to the presence of the color filters CFs. However, according to the configuration of the present embodiment, the color filters CFs are each provided only in the light emitting area U (light emitting element portion 406). Therefore, a decrease in transmittance can be prevented.

In the organic EL device of the present embodiment, the same transmittance as in the second embodiment can be obtained.

EXAMPLES

Some aspects of the disclosure are described below in detail by way of Examples. However, the disclosure is not limited by these examples.

Example 1

Figure 23:
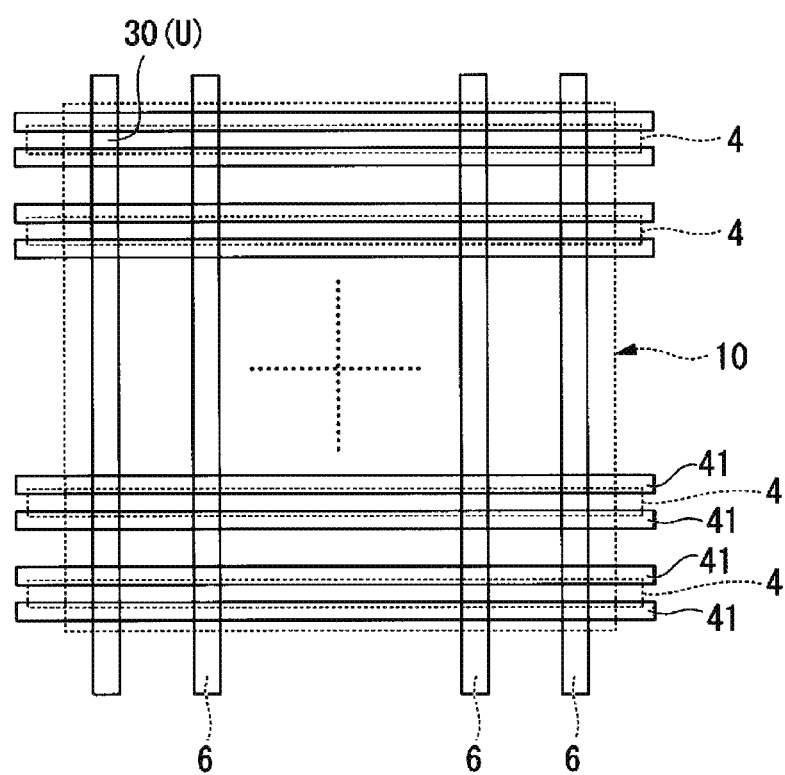
FIG. 23 is a view illustrating a schematic configuration of a display region of an organic EL device in Example 1.

FIG. 23 is a view illustrating a schematic configuration of a display region of an organic EL device in Example 1.

In Example 1, a pair of banks 41, 41 are provided on both sides of the first electrode 4 in the width direction. Each bank 41 is extended along the first electrode 4, and is provided so as to overlap the first electrode 4 and have a width larger than that of the first electrode 4 by at least 1 μm. The first electrode 4 and the second electrode 6 each have a width of approximately 30 μm.

Thus, light cannot be emitted in a region other than the pixels.

Example 2

Figure 24:
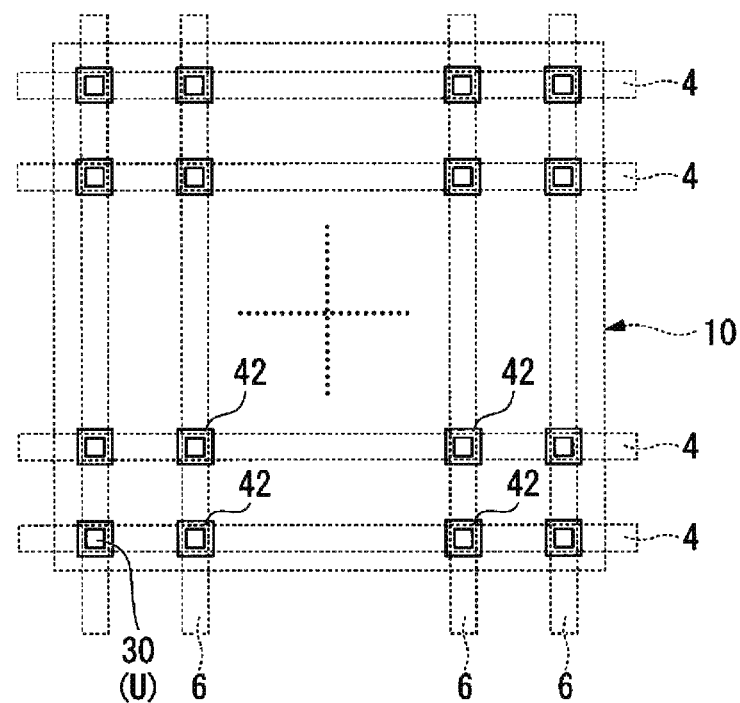
FIG. 24 is a view illustrating a schematic configuration of a display region of an organic EL device in Example 2.

FIG. 24 is a view illustrating a schematic configuration of a display region of an organic EL device in Example 2.

In Example 2, at a portion where each of the first electrodes 4 and each of the second electrodes 6 overlap each other, a plurality of banks 42 are provided. The plurality of banks 42 in the display region 10 surround the organic EL element 30 (light emitting area U) provided in the portion where each of the first electrodes 4 and each of the second electrodes 6 overlap. The plurality of banks 42 are each a bank having a frame shape as viewed in plan view. The width of an overlap of each of the banks 42 with each of the first electrodes 4 is at least 1 μm. The width of an overlap of each of the banks 42 with each of the second electrodes 6 is at least 0.5 μm.

Thus, light cannot be emitted particularly in a region other than orthogonal pixels.

Although the preferred embodiments of the disclosure have been described with reference to the accompanying drawing, the disclosure is not limited to such embodiments. It is apparent to those skilled in the art that various alternations or modifications can be made in the category of technical spirit as set forth in the claims, and it will be understood that these alternations or modifications naturally belongs to the technical scope of the disclosure.

In each of the embodiments, the light emitting element has the plurality of recessed portions. However, the light emitting element may have only single recessed portion.

Although a description has been given in the embodiments above regarding examples of cases in which the cross-sectional profile of the recessed portion is a circular arc, the cross-sectional profile of the recessed portion does not need to be a circular arc. The cross-sectional profile of the recessed portions may include, for example, an elliptical or an optional curved line, or may partially include a straight line.

In addition, specific configuration such as the shape, dimensions, number, disposition, configuration materials, and forming processes of each portion of the organic EL device are not limited to the embodiments above, and may be appropriately modified.

Moreover, the organic EL device according to one aspect of the disclosure may be applied to an illuminating device or the like in addition to the display device. For example, when one aspect of the disclosure is applied to an illumination device that generates white light, the illumination device may not have a configuration in which a plurality of unit regions that are separated and emit light of different color, as described in the embodiment described above.

Specifically, three kinds of dopant dyes of red, green, and blue may be doped in one light emitting layer, a layered structure including a hole-transporting blue light-emitting layer, an electron-transporting green light-emitting layer, and an electron-transporting red light-emitting layer may be provided, or a layered structure including an electron-transporting blue light-emitting layer, an electron-transporting green light-emitting layer, and an electron-transporting red light emitting-layer may be provided.

INDUSTRIAL APPLICABILITY

Some aspects of the disclosure can be used in an optional electronic apparatus having a light-emitting portion, such as a display device and an illumination device.

REFERENCE SIGNS LIST

2 Base material
3 Reflective layer
4 First electrode
5 Organic layer
5b Lower face
6 Second electrode
9 Recessed portion
Q Plane
T Transmissive area
U Light emitting area
11 (11B, 11G, 11R) Unit region, sub pixel
12 Filling layer
16 Light emitting layer
30 Organic EL element (light emitting element)
CF Color Filter
L1 Light
Tr Thin film transistor (active element)
206, 306, 406 Light emitting element portion (light emitting element)
100, 200 Organic EL display device (organic electroluminescence device, illumination device, display device)

The invention claimed is:

1. An organic electroluminescence device comprising:
a substrate;
a foundation layer disposed on the substrate, the foundation layer including at least one recessed portion and an upper face surrounding a peripheral portion of the at least one recessed portion, the foundation layer being made of a resin; and
a light emitting element including:
a reflective layer disposed on a surface of the at least one recessed portion and a portion of the upper face of the foundation layer,
a filling layer disposed at an inside of the at least one recessed portion via the reflective layer, the filling layer having optical transparency,
a first electrode disposed above the filling layer, the first electrode being disposed at a portion of the upper face of the foundation layer, the first electrode having optical transparency,
an organic layer disposed above the first electrode, the organic layer including a light emitting layer, and
a second electrode disposed above the organic layer, the second electrode having optical transparency, wherein
the light emitting element is provided in a display region,
the display region is divided into a plurality of unit regions,
the plurality of unit regions each including the light emitting element, a light emitting area, and a transmissive area,
the light emitting area and the transmissive area are partitioned,
a lower face of the first electrode at a first position of the at least one recessed portion is positioned below a lower face of the reflective layer at a second position of the upper face of the foundation layer, and
the reflective layer is in contact with the first electrode at a third position inside of the at least one recessed portion, the third position being between the upper face of the foundation layer and an upper face of the filling layer.

2. The organic electroluminescence device according to claim 1, wherein the light emitting area and the transmissive area satisfy a ratio of the light emitting area to a sum of the light emitting area and the transmissive area of less than 50%.

3. The organic electroluminescence device according to claim 1, wherein
the at least one recessed portion includes a plurality of recessed portions,
the plurality of recessed portions are disposed in the light emitting area, and
the reflective layer is disposed in the plurality of recessed portions.

4. The organic electroluminescence device according to claim 1, wherein a portion of the reflective layer is in contact with a portion of the first electrode.

5. The organic electroluminescence device according to claim 1, wherein a lower face of the first electrode at a fourth position inside the at least one recessed portion is positioned lower than a plane including an upper face of the foundation layer.

6. The organic electroluminescence device according to claim 1, wherein
the light emitting area includes a plurality of active elements, and
each of the plurality of active elements independently controls light emission.

7. The organic electroluminescence device according to claim 6, wherein the plurality of active elements are made of an oxide semiconductor.

8. The organic electroluminescence device according to claim 6, wherein the plurality of active elements are electrically connected to the light emitting element via the reflective layer.

9. The organic electroluminescence device according to claim 6, further comprising:
a wiring line that controls the plurality of active elements, wherein the reflective layer is provided on the wiring line.

10. The organic electroluminescence device according to claim 1, further comprising:
a color filter on the light emitting element.

11. The organic electroluminescence device according to claim 10, wherein the color filter has a size substantially similar to a region where the reflective layer is provided.

12. The organic electroluminescence device according to claim 1, wherein
an upper face of the filling layer is below the upper face of the foundation layer, and
the reflective layer is in contact with the first electrode between a peripheral portion of the upper face of the filling layer and the peripheral portion of the at least one recessed portion.

13. The organic electroluminescence device according to claim 1, wherein the reflective layer is in contact with the first electrode at the upper face of the foundation layer.

14. The organic electroluminescence device according to claim 13, wherein the substrate, the foundation layer, the reflective layer, the first electrode, the organic layer, and the second electrode are disposed in a same order at the second position.

15. A method for manufacturing an organic electroluminescence device, the method comprising:
forming a foundation layer on a substrate, the foundation layer being made of a resin;
forming at least one recessed portion on an upper face of the foundation layer such that the foundation layer includes the at least one recessed portion and an upper face of the foundation layer surrounds a peripheral portion of the at least one recessed portion;
forming a reflective layer on a surface of the at least one recessed portion and a portion of the upper face of the foundation layer;
forming a filling layer having optical transparency at an inside of the at least one recessed portion via the reflective layer;
forming a first electrode having optical transparency above the filling layer;
forming an organic layer above the first electrode, the organic layer including a light emitting layer; and
forming a second electrode above the organic layer, the second electrode having optical transparency, wherein
the light emitting element is provided in a display region,
the display region is divided into a plurality of unit regions,
the plurality of unit regions each including the light emitting element, a light emitting area, and a transmissive area,
the light emitting area and the transmissive area are partitioned,
a lower face of the first electrode at a first position of the at least one recessed portion is positioned below a lower face of the reflective layer at a second position of the upper face of the foundation layer, and
the reflective layer is in contact with the first electrode at a third position inside of the at least one recessed portion, the third position being between the upper face of the foundation layer and an upper face of the filling layer.

16. An illumination device comprising:
a substrate;
a foundation layer disposed on the substrate, the foundation layer including at least one recessed portion and an upper face surrounding a peripheral portion of the at least one recessed portion, the foundation layer being made of a resin; and
a light emitting element including:
a reflective layer disposed on a surface of the at least one recessed portion and a portion of the upper face of the foundation layer,
a filling layer disposed at an inside of the at least one recessed portion via the reflective layer, the filling layer having optical transparency,
a first electrode disposed above the filling layer, the first electrode being disposed at a portion of the upper face of the foundation layer, the first electrode having optical transparency,
an organic layer disposed above the first electrode, the organic layer including a light emitting layer, and
a second electrode disposed above the organic layer, the second electrode having optical transparency, wherein
the light emitting element is provided in a display region,
the display region is divided into a plurality of unit regions,
the plurality of unit regions each including the light emitting element, a light emitting area, and a transmissive area,
the light emitting area and the transmissive area are partitioned,
a lower face of the first electrode at a first position of the at least one recessed portion is positioned below a lower face of the reflective layer at a second position of the upper face of the foundation layer, and
the reflective layer is in contact with the first electrode at a third position inside of the at least one recessed portion, the third position being between the upper face of the foundation layer and an upper face of the filling layer.

17. A display device comprising:
a substrate;
a foundation layer disposed on the substrate, the foundation layer including at least one recessed portion and an upper face surrounding a peripheral portion of the at least one recessed portion, the foundation layer being made of a resin; and
a light emitting element including:
a reflective layer disposed on a surface of the at least one recessed portion and a portion of the upper face of the foundation layer,
a filling layer disposed at an inside of the at least one recessed portion via the reflective layer, the filling layer having optical transparency,
a first electrode disposed above the filling layer, the first electrode being disposed at a portion of the upper face of the foundation layer, the first electrode having optical transparency,
an organic layer disposed above the first electrode, the organic layer including a light emitting layer, and a second electrode disposed above the organic layer, the second electrode having optical transparency, wherein the light emitting element is provided in a display region, the display region is divided into a plurality of unit regions, the plurality of unit regions each including the light emitting element, a light emitting area, and a transmissive area, the light emitting area and the transmissive area are partitioned, a lower face of the first electrode at a first position of the at least one recessed portion is positioned below a lower face of the reflective layer at a second position of the upper face of the foundation layer, and the reflective layer is in contact with the first electrode at a third position inside of the at least one recessed portion, the third position being between the upper face of the foundation layer and an upper face of the filling layer.

* * * * *